(12) United States Patent
Iwasaki

(10) Patent No.: US 7,280,411 B2
(45) Date of Patent: Oct. 9, 2007

(54) OUTPUT BUFFER CIRCUIT AND SEMICONDUCTOR MEMORY USING THE SAME

(75) Inventor: Go Iwasaki, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 283 days.

(21) Appl. No.: 10/721,310

(22) Filed: Nov. 25, 2003

(65) Prior Publication Data

US 2004/0136221 A1 Jul. 15, 2004

(30) Foreign Application Priority Data

Nov. 28, 2002 (JP) ............... 2002-344926

(51) Int. Cl.
*G11C 7/00* (2006.01)

(52) U.S. Cl. ............. 365/189.05; 365/100; 365/189.11

(58) Field of Classification Search ................ 365/100, 365/189.11, 189.05, 189.03, 148

See application file for complete search history.

(56) References Cited

U.S. PATENT DOCUMENTS

| | | | |
|---|---|---|---|
| 4,885,485 A | | 12/1989 | Leake et al. |
| 5,099,148 A | * | 3/1992 | McClure et al. ............ 327/543 |
| 5,355,029 A | * | 10/1994 | Houghton et al. ............ 326/26 |
| 5,517,142 A | * | 5/1996 | Jang et al. ................... 327/108 |
| 5,804,987 A | | 9/1998 | Ogawa et al. |
| 6,041,013 A | * | 3/2000 | Kohno ................... 365/230.03 |
| 6,097,237 A | * | 8/2000 | Singh ......................... 327/389 |
| 6,121,789 A | * | 9/2000 | Liu et al. ..................... 326/26 |
| 6,204,692 B1 | * | 3/2001 | Nakagawa ............. 365/230.06 |
| 6,366,114 B1 | * | 4/2002 | Liu et al. ..................... 326/27 |
| 6,384,621 B1 | * | 5/2002 | Gibbs et al. ................. 326/30 |
| 6,737,886 B2 | * | 5/2004 | Curatolo et al. ............. 326/83 |
| 6,812,734 B1 | * | 11/2004 | Shumarayev et al. ....... 327/108 |
| 2002/0030517 A1 | * | 3/2002 | Kurisu et al. ............... 327/108 |

FOREIGN PATENT DOCUMENTS

| | | |
|---|---|---|
| JP | 06-224731 | 8/1994 |
| JP | 09-018326 | 1/1997 |
| JP | 10-107607 | 4/1998 |
| JP | 11-025678 | 1/1999 |
| JP | 2000-022516 | 1/2000 |
| JP | 2001-352238 | 12/2001 |

OTHER PUBLICATIONS

Japanese Office Action for Patent Application No. 344926/2002, issued Aug. 4, 2006 with English translation.

* cited by examiner

*Primary Examiner*—Thong Q. Le
(74) *Attorney, Agent, or Firm*—Hogan & Hartson LLP

(57) ABSTRACT

An output buffer circuit of the present invention includes a plurality of unit circuits in each of which a pull-up transistor controlled by a first input signal is connected between a high-potential power supply and common node, and a pull-down transistor controlled by a second input signal is connected between the common node and a low-potential power supply, an output terminal connected to a common connecting point of the common nodes of the plurality of unit circuits, and first resistors formed respectively between the common nodes of the plurality of unit circuits and the common connecting point.

11 Claims, 11 Drawing Sheets

OUTPUT BUFFER CIRCUIT AND SEMICONDUCTOR MEMORY USING THE SAME

CROSS REFERENCE TO RELATED APPLICATION

This application is based upon and claims benefit of priority under 35 USC 119 from the Japanese Patent Application No. 2002-344926, filed on Nov. 28, 2002, the entire contents of which are incorporated herein by reference.

BACKGROUND OF THE INVENTION

The present invention relates to a high-speed semiconductor integrated circuit and, more particularly, to an output buffer circuit used in a high-speed, large-capacity memory operating at a few hundred Mbps or more and a semiconductor memory using the same.

Recently, the operating speed and integration degree of a semiconductor memory are remarkably increasing with the advance of semiconductor technologies. The operating speed of a semiconductor memory such as a DRAM has increased to a few hundred Mbps to 1 Gbps, i.e., has become equivalent to that of a high-speed compound device, and the integration degree of a semiconductor memory has increased to a few hundred Mb or more. Accordingly, such semiconductor memories are extensively used in desktop personal computers, laptop personal computers, various servers, network-related apparatuses, PDAs, car navigation systems, game apparatuses, cell phones, and the like.

Along with this extensive use, semiconductor memories used in different applications are required to have different output characteristics, i.e., several types of output characteristics or more. Known required standards of these output characteristics are those shown in FIG. 12 (e.g., non-patent reference 1 to be described later).

FIG. 12 is a graph showing pull-down characteristic specifications of driver characteristic specifications required of an output buffer circuit of a DDR-SDRAM (Double Date Rate-Synchronous DRAM). FIG. 13 is a graph showing pull-up characteristic specifications.

As shown in FIGS. 12 and 13, the driver characteristic specifications required of the output driver disclosed in non-patent reference 1 are proposed as two types of output characteristic standards of a semiconductor memory from JEDEC in order to meet different applications. In each of FIGS. 12 and 13, a region indicated by the solid lines (i.e., a region indicated by the upper and lower limits) requires a large electric current, i.e., a small load, and is generally called full-strength. On the other hand, a region indicated by the broken lines (i.e., a region indicated by the upper and lower limits) requires a small electric current, i.e., a large load, and is generally called half-strength.

The driving current of the buffer circuit under the pull-down and pull-up half-strength conditions is substantially ½ that under the identical full-strength conditions.

Non-patent reference 1: JEDEC Solid State Technology Association 2000 "JEDEC STANDARD DDR SDRAM Specification" (Item 1112.2, Item 1112A)

As a conventional method of simultaneously satisfying the above-mentioned two types of output characteristic standards of a semiconductor memory with one type of product, the gate width of a MIS transistor forming the output buffer circuit is changed by means of, e.g., trimming, to meet the full-strength conditions and half-strength conditions. Alternatively, two types of gate masks are prepared to meet the full-strength conditions and half-strength conditions. However, these methods have problems such as addition of new steps, an increase in number of gate masks, and replacement of the gate masks.

SUMMARY OF THE INVENTION

According to an aspect of the present invention, there is provided an output buffer circuit comprising: a plurality of unit circuits in each of which a pull-up transistor controlled by a first input signal is connected between a high-potential power supply and common node, and a first pull-down transistor controlled by a second input signal and a second pull-down transistor controlled by a third input signal are connected in series between said common node and a low-potential power supply; an output terminal connected to a common connecting point of said common nodes of said plurality of unit circuits; and first resistors formed respectively between said common nodes of said plurality of unit circuits and said common connecting point.

According to an aspect of the present invention, there is provided an output buffer circuit comprising: a plurality of unit circuits in each of which a plurality of pull-up transistors controlled by an input signal are connected in series between a high-potential power supply and common node, and a plurality pull-down transistors controlled by an input signal are connected in series between said common node and a low-potential power supply; an output terminal connected to a common connecting point of said common nodes of said plurality of unit circuits; and first resistors formed respectively between said common nodes of said plurality of unit circuits and said common connecting point.

According to an aspect of the present invention, there is provided An output buffer circuit comprising: a plurality of unit circuits in each of which a pull-up transistor controlled by a first input signal is connected between a high-potential power supply and common node, and a pull-down transistor controlled by a second input signal is connected between said common node and a low-potential power supply; an output terminal connected to a common connecting point of said common nodes of said plurality of unit circuits; and second resistors formed respectively between said high-potential power supply and pull-up transistor and between said pull-down transistor and low-potential power supply in each of said unit circuits.

According to an aspect of the present invention, there is provided An output buffer circuit comprising: a plurality of unit circuits in each of which a pull-up transistor controlled by a first input signal is connected between a high-potential power supply and common node, and a pull-down transistor controlled by a second input signal is connected between said common node and a low-potential power supply; an output terminal connected to a common connecting point of said common nodes of said plurality of unit circuits; and third resistors formed respectively between said pull-up transistor and common node and between said common node and pull-down transistor in each of said unit circuits.

According to an aspect of the present invention, there is provided a semiconductor memory comprising: a plurality of memory cells; a plurality of terminals including an output terminal; and an output buffer circuit positioned adjacent to said memory cell, said output buffer circuit comprising a plurality of unit circuits in each of which a pull-up transistor controlled by a first input signal is connected between a high-potential power supply and common node and a pull-down transistor controlled by a second input signal is connected between said common node and a low-potential power supply, and comprising first resistors connected respectively between said common nodes of said plurality of unit circuits and a common connecting point of said common nodes.

DESCRIPTION OF THE PREFERRED EMBODIMENTS

Embodiments of the present invention will be described below with reference to the accompanying drawings.

First Embodiment

Figure 1:
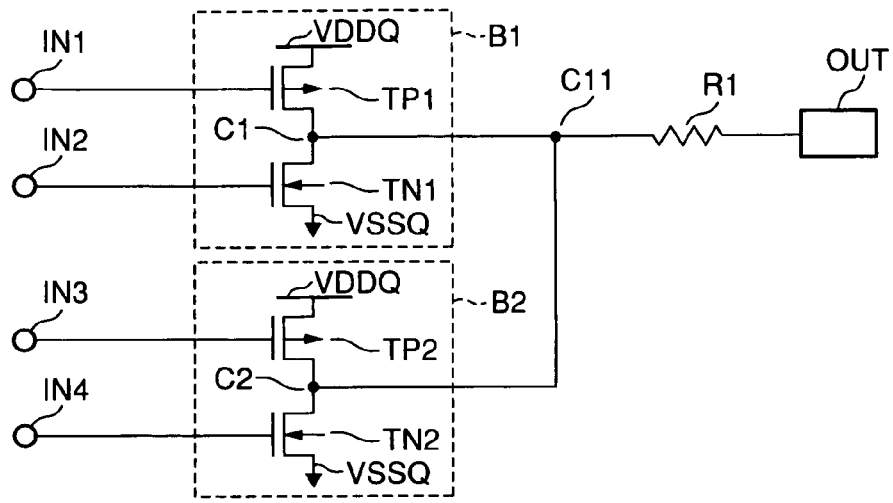
FIG. 1 is a circuit diagram showing an output buffer circuit according to the first embodiment of the present invention.
Figure 2:
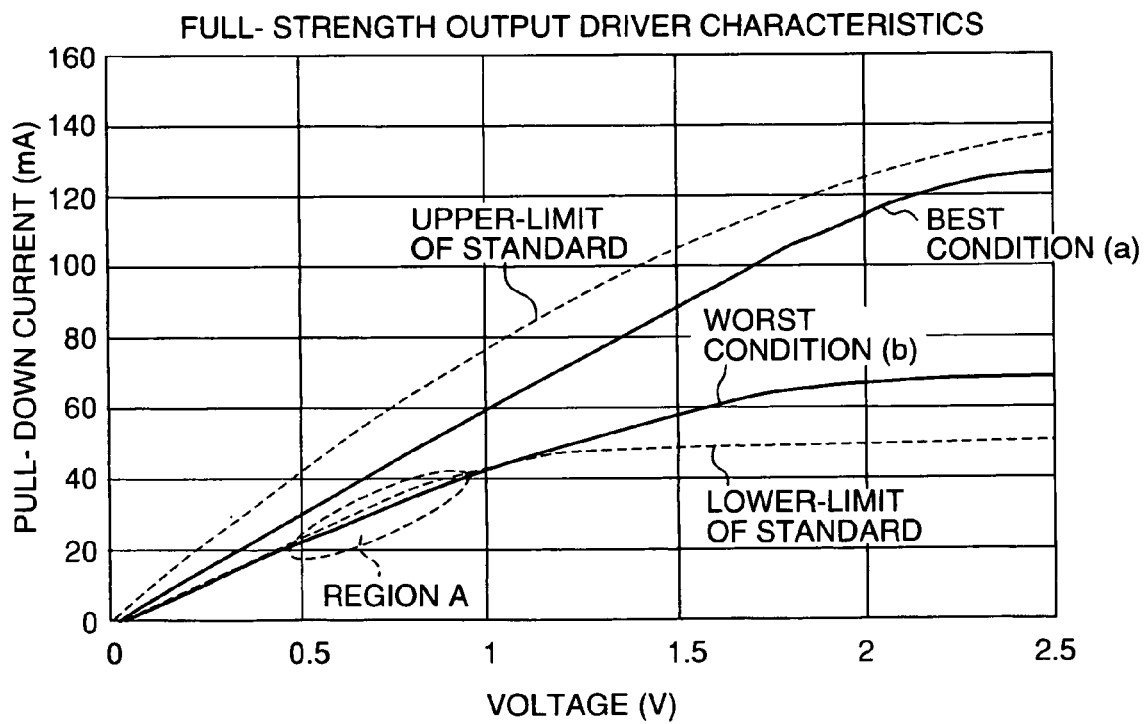
FIG. 2 is a graph showing the output driver characteristics of the output buffer circuit according to the first embodiment of the present invention.

An output buffer circuit according to the first embodiment of the present invention will be described below with reference to FIGS. 1 and 2. FIG. 1 is a circuit diagram of this output buffer circuit. FIG. 2 is a graph of the output driver characteristics of the output buffer circuit. In the first embodiment, the present invention is applied to a 256-Mb DDR SDRAM.

As shown in FIG. 1, this output buffer circuit has first to fourth input terminals IN1, IN2, IN3, and IN4 for receiving signals from inside a semiconductor memory, and an output terminal OUT for supplying signals outside the semiconductor memory.

Between a high-potential power supply VDDQ and common node C1, a pull-up transistor TP1 which is, e.g., a P-channel MIS transistor controlled by an input signal from the first input terminal IN1 is connected. Between the common node C1 and a low-potential power supply VSSQ, a pull-down transistor TN1 which is, e.g., an N-channel MIS transistor controlled by an input signal from the second input terminal IN2 is connected. In this manner, a buffer circuit constituting unit (to be simply referred to as a unit circuit hereinafter) B1 is formed.

Similar to the unit circuit B1 described above, a pull-up transistor TP2 which is a P-channel MIS transistor controlled by an input signal from the third input terminal IN3 is connected between the high-potential power supply VDDQ and a common node C2, and a pull-down transistor TN2 which is an N-channel MIS transistor controlled by an input signal from the fourth input terminal IN4 is connected between the common node C2 and low-potential power supply VSSQ, thereby forming a unit circuit B2.

The common node C1 of the unit circuit B1 and the common node C2 of the unit circuit B2 are connected together to a common connecting point C11 which is connected to the output terminal OUT via a thin-film resistor R1. Output currents from the unit circuits B1 and B2 are controlled by input signals applied to the input terminals IN1, IN2, IN3, and IN4.

The pull-up transistors TP1 and TP2 and pull-down transistors TN1 and TN2 have the same transistor shape (i.e., the same gate length and the same gate width).

The shapes of these transistors, however, need not be the same and can also be made different from each other.

Also, the transistors used in the unit circuits have a gate length larger than that of transistors used in the semiconductor memory in order to control the process variation. Since the gate length is large, even if a variation is present in the gate length, the influence the variation has on the whole gate length can be decreased.

The thin-film resistor R1 is a metal film made of W (tungsten) having a resistance variation, voltage change, and temperature change smaller than those of a MIS transistor. However, it is also possible to use a thin metal film of, e.g., Ni or Cr, a composite metal film of, e.g., NiCr, a metal cermet film of, e.g., $CrSiO_x$, a P- or N-type polysilicon film, a P- or N-type diffusion layer, or a transistor such as a depression type MIS transistor.

The operation of the above-mentioned output buffer circuit will be explained below. A full-strength output current on the pull-up side is obtained by turning on both the pull-up transistors TP1 and TP2 by input signals from the input terminals IN1 and IN3, respectively. A half-strength output current on the pull-up side is obtained by turning on one of the pull-up transistors TP1 and TP2 by one of input signals from the input terminals IN1 and IN3, respectively. This half-strength output current is set at about ½ the full-strength output current.

A full-strength output current on the pull-down side is obtained by turning on both the pull-down transistors TN1 and TN2 by input signals from the input terminals IN2 and IN4, respectively. A half-strength output current on the pull-down side is obtained by turning on one of the pull-down transistors TN1 and TN2 by one of input signals from the input terminals IN2 and IN4, respectively. This half-strength output current is set at about ½ the full-strength output current.

The relationship between the drain current and gate voltage of a MIS transistor is generally indicated by $$Id \approx (\mu \epsilon Si \epsilon_o W/TINL)[(VG-VT)VD-VD^2/2] \quad (1)$$

where VG−VT>>VD>0

$$Id = \frac{1}{2}(\mu \epsilon Si \epsilon_o W/TINL)(VG-VT)^2 \quad (2)$$

for VD>>VG−VT>0

Where Id is the drain current, $\mu$ is the mobility, $\epsilon Si$ is the relative dielectric constant of silicon, $\epsilon_o$ is the dielectric constant in a vacuum, TIN is the gate insulating film thickness of a MIS transistor, W is the gate width of a MIS transistor, L is the gate length of a MIS transistor, VG is the gate voltage of a MIS transistor, VD is the drain voltage of a MIS transistor, and VT is the threshold voltage of a MIS transistor. Equation (1) represents a linear region in which the drain current is substantially proportional to the gate voltage if VT takes a small value. Equation (2) represents a saturation region in which the drain current is proportional to the square of (VG−VT); if VT takes a small value, it is substantially proportional to the square of the gate voltage.

In the above output buffer circuit, the drain current (Id) used in equations (1) and (2) is equivalent to the output current, and the drain voltage (VD) is equivalent to the power supply voltage. Also, the low-voltage region is equivalent to the linear region, and the high-voltage region is equivalent to the saturation region.

In the JEDEC standards, the variation tolerance in the linear region is smaller than that in the saturation region.

The MIS transistor used in the output buffer circuit has a large gate width (W) of a few hundred μm or more and a gate length (L) of sub μm. Therefore, the variation in output current from the output buffer circuit varies in accordance with the gate length (L) and gate insulating film thickness (TIN) of the MIS transistor, the variation in high-potential voltage VDDQ, and the operating temperature.

The fabrication variations of the two transistors are added to the full-strength output current, so the variation in output current from the output buffer circuit further increases.

In this output buffer circuit, however, the metal-film resistor (W metal film) is formed on the output terminal side in order to limit the electric current. Therefore, if the electric current of the MIS transistor of the output buffer circuit increases due to variations, the variation in output current reduces (at particularly full-strength) in the linear region.

In addition, to reduce the gate length variation, the gate length (L) in the saturation region is made larger than that of the transistors in the semiconductor memory. This reduces the variation in output current in the saturation region.

FIG. 2 is a graph showing the output driver characteristics of the output buffer circuit of the first embodiment of the present invention. In FIG. 2, the solid lines ((a) and (b)) indicate the characteristics of the embodiment of the present invention, and the broken lines indicate the standards defined by JEDEC.

This graph shows the full-strength output characteristics on the pull-down side. The abscissa indicates the voltage of the high-potential power supply VDDQ, and the ordinate indicates the output current. The solid line (a) indicates the best characteristic condition which satisfies the upper-limit process characteristic of the N-channel MIS transistor, the voltage condition of the upper-side standard, and the temperature standard on the low-temperature side. The solid line (b) indicates the worst characteristic condition which satisfies the lower-limit process condition of the N-channel MIS transistor, the voltage condition of the lower-side standard, and the temperature standard on the high-temperature side.

As shown in FIG. 2, in a region A (linear region) under the worst condition, the JEDEC standards are substantially met, albeit barely. Although not shown, all of the full-strength characteristic on the pull-up side, the half-strength output characteristic on the pull-up side, and the output characteristic on the pull-down side fall within the range of the JEDEC standards.

In the output buffer circuit of this embodiment, a metal-film resistor having a resistance variation, voltage change, and temperature change smaller than those of the MIS transistor of the output buffer circuit is formed on the output terminal side. This limits the direction in which the electric current of the MIS transistor of the output buffer circuit increases due to variations, thereby reducing the variation in output current of the output buffer circuit. Consequently, the output current variation in the linear region reduces.

In the saturation region, the gate length is made larger than that of the transistors in the semiconductor memory. Since this reduces the gate length variation, the output current variation in the saturation region also reduces. Accordingly, the two types of output characteristic standards of the semiconductor memory can be simultaneously met without adding any new steps, increasing the number of gate masks, or replacing the gate masks.

Furthermore, since the resistor is formed on the output terminal side, the electrostatic withstand voltage of the MIS transistor of the output buffer circuit increases, and this increases the electrostatic withstand voltage as a whole.

Second Embodiment

Figure 3:
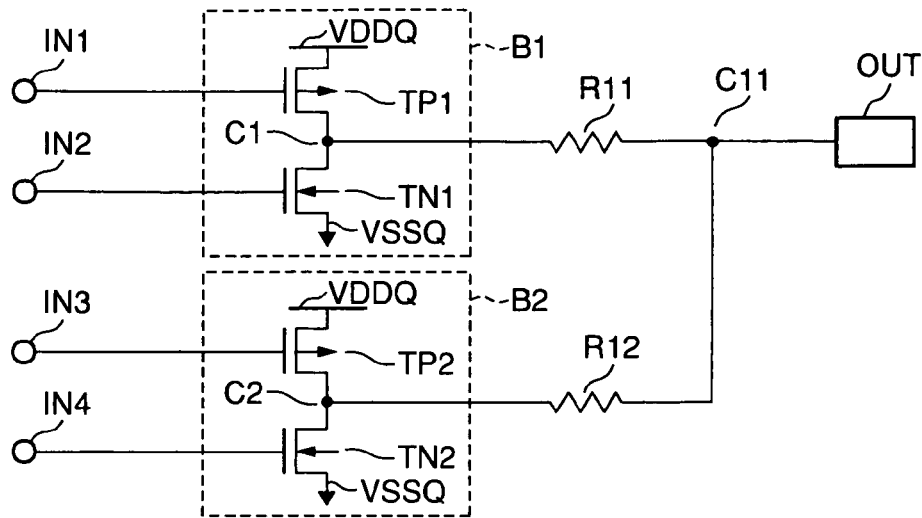
FIG. 3 is a circuit diagram showing an output buffer circuit according to the second embodiment of the present invention.
Figure 4:
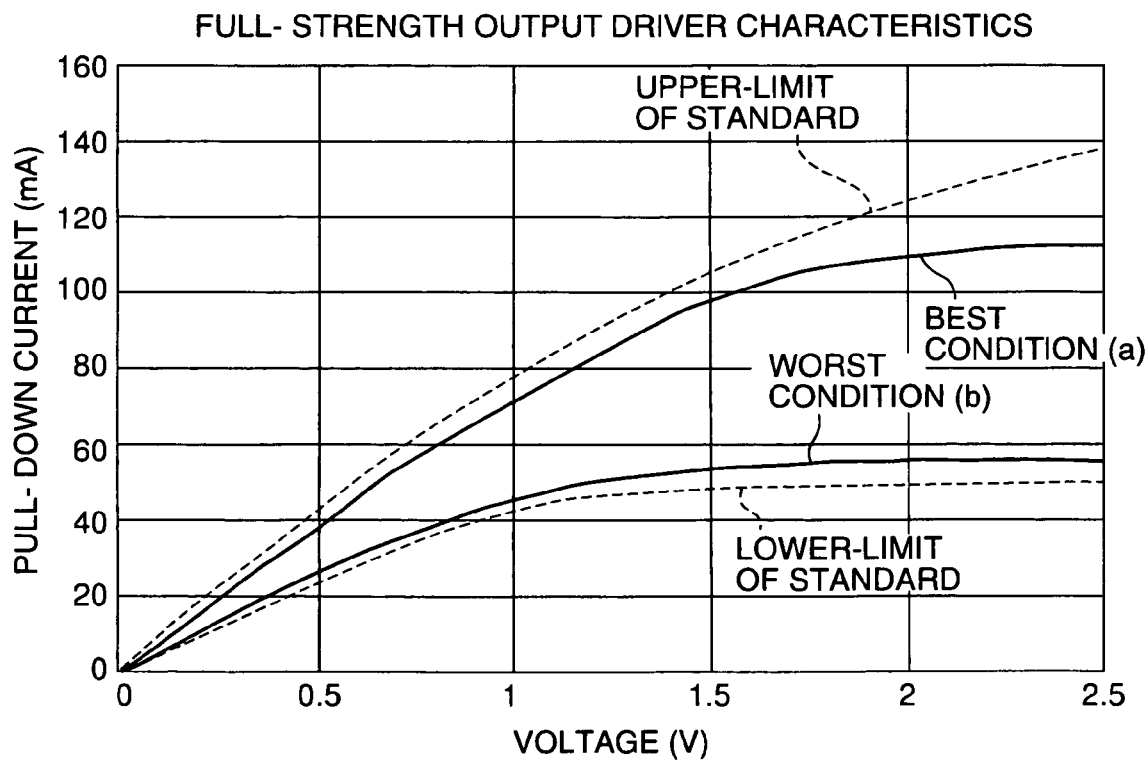
FIG. 4 is a graph showing the output driver characteristics of the output buffer circuit according to the second embodiment of the present invention.

An output buffer circuit according to the second embodiment of the present invention will be described below with reference to FIGS. 3 and 4. FIG. 3 is a circuit diagram of this output buffer circuit. FIG. 4 is a graph of the output driver characteristics of the output buffer circuit.

The output buffer circuit of this embodiment is the same as the first embodiment except that the positions and number of resistors are changed. In this embodiment, an operation margin larger than that of the first embodiment can be obtained.

In the first embodiment as described above, the shapes of the transistors TP1, TP2, TN1, and TN2 can be changed as needed in order to satisfy the standards of full-strength and half-strength.

In contrast, it is possible in the second embodiment not only to change the transistor shapes but also to make resistances R11 and R12 different as needed so as to satisfy the individual standards.

In the second embodiment, therefore, the number of settable parameters is larger than that in the first embodiment, so the degree of freedom of design can be increased.

As shown in FIG. 3, the output buffer circuit has first to fourth input terminals IN1, IN2, IN3, and IN4 for receiving signals from inside a semiconductor memory, and an output terminal OUT for supplying signals outside the semiconductor memory.

Between a high-potential power supply VDDQ and common node C1, a pull-up transistor TP1 which is, e.g., a P-channel MIS transistor controlled by an input signal from the first input terminal IN1 is connected. Between the common node C1 and a low-potential power supply VSSQ, a pull-down transistor TN1 which is, e.g., an N-channel MIS transistor controlled by an input signal from the second input terminal IN2 is connected. In this manner, a unit circuit B1 is formed.

Similar to the unit circuit B1 described above, a pull-up transistor TP2 which is a P-channel MIS transistor controlled by an input signal from the third input terminal IN3 is connected between the high-potential power supply VDDQ and a common node C2, and a pull-down transistor TN2 which is an N-channel MIS transistor controlled by an input signal from the fourth input terminal IN4 is connected between the common node C2 and low-potential power supply VSSQ, thereby forming a unit circuit B2.

First resistors R11 and R12 are connected between the common node C1 of the unit circuit B1 and a common connecting point C11, and between the common node C2 of the unit circuit B2 and the common connecting point C11, respectively. The output terminal OUT is connected to the common connecting point C11. Output currents from the unit circuits B1 and B2 are controlled by input signals applied to the input terminals IN1, IN2, IN3, and IN4.

The first resistors R11 and R12 have the same value, and the pull-up transistors TP1 and TP2 and pull-down transistors TN1 and TN2 have the same transistor shape (i.e., the same gate length and the same gate width).

The shapes of these transistors, however, may also be made different from each other.

Also, each of the transistors TP1, TP2, TN1 and TN2 used in the unit circuits B1 and B2 have a gate length larger than that of transistors used in a semiconductor memory in order to control the process variation. Since the gate length is large, even if a variation is present in the gate length, the influence the variation has on the whole gate length can be decreased.

The first resistors R11 and R12 can be a metal film made of W (tungsten) having a resistance variation, voltage change, and temperature change smaller than those of a MIS transistor.

The operation of the above-mentioned output buffer circuit will be explained below. A full-strength output current on the pull-up side is obtained by turning on both the pull-up transistors TP1 and TP2 by input signals from the input terminals IN1 and IN3, respectively. A half-strength output current on the pull-up side is obtained by turning on one of the pull-up transistors TP1 and TP2 by one of input signals from the input terminals IN1 and IN3, respectively. This half-strength output current is set at about ½ the full-strength output current.

A full-strength output current on the pull-down side is obtained by turning on both the pull-down transistors TN1 and TN2 by input signals from the input terminals IN2 and IN4, respectively. A half-strength output current on the pull-down side is obtained by turning on one of the pull-down transistors TN1 and TN2 by one of input signals from the input terminals IN2 and IN4, respectively. This half-strength output current is set at about ½ the full-strength output current.

In the above output buffer circuit, the drain current (Id) used in equations (1) and (2) is equivalent to the output current, and the drain voltage (VD) is equivalent to the power supply voltage. Also, the low-voltage region is equivalent to the linear region, and the high-voltage region is equivalent to the saturation region.

In the JEDEC standards, the variation tolerance in the linear region is smaller than that in the saturation region.

The MIS transistor used in the output buffer circuit has a large gate width (W) of a few hundred μm or more and a gate length (L) of sub μm. Therefore, the variation in output current from the output buffer circuit varies in accordance with the gate length (L) and gate insulating film thickness (TIN) of the MIS transistor, the variation in high-potential voltage VDDQ, and the operating temperature.

The fabrication variations of the two transistors are added to the full-strength output current, so the variation in output current from the output buffer circuit further increases.

In this output buffer circuit, however, the metal-film resistor (W metal film) is formed for each unit circuit on the output terminal side in order to limit the electric current. Therefore, if the electric current of the MIS transistor of the output buffer circuit increases due to variations, the variations in output currents in both the full-strength and half-strength linear regions are reduced.

In addition, to reduce the gate length variation, the gate length (L) in the saturation region is made larger than that of the transistors in the semiconductor memory. This reduces the variation in output current in the saturation region. Since the identical resistors are used for the individual unit circuits, the half-strength standard is satisfied. At the same time, in the case of full-strength, the resistance can be made smaller than that in the first embodiment because the resistors are connected in parallel, so a large electric current can be obtained.

FIG. 4 is a graph showing the output driver characteristics of the output buffer circuit of the second embodiment of the present invention. In FIG. 4, the solid lines ((a) and (b)) indicate the characteristics of the embodiment of the present invention, and the broken lines indicate the standards defined by JEDEC.

This graph shows the full-strength output characteristics on the pull-down side. The abscissa indicates the voltage of the high-potential power supply VDDQ, and the ordinate indicates the output current. The solid line (a) indicates the best characteristic condition which satisfies the upper-limit process characteristic of the N-channel MIS transistor, the voltage condition of the upper-side standard, and the temperature standard on the low-temperature side. The solid line (b) indicates the worst characteristic condition which satisfies the lower-limit process condition of the N-channel MIS transistor, the voltage condition of the lower-side standard, and the temperature standard on the high-temperature side. Both the best and worst characteristic conditions well satisfy the JEDEC standards.

Although not shown, all of the full-strength characteristic on the pull-up side, the half-strength output characteristic on the pull-up side, and the output characteristic on the pull-down side well satisfy the JEDEC standards.

In the output buffer circuit of this embodiment, a metal-film resistor having a resistance variation, voltage change, and temperature change smaller than those of the MIS transistor of the output buffer circuit is formed between the common node of each unit circuit and the common connecting point. This limits the directions in which the half-strength and full-strength output currents in the linear region of the output buffer circuit increase due to variations, thereby reducing variations in both half-strength and full-strength output currents of the output buffer circuit.

In the saturation region, the gate length is made larger than that of the transistors in the semiconductor memory. Therefore, the gate length variation reduces, and the output current variation in the saturation region also reduces. Furthermore, since the individual unit circuits have the identical resistors, the half-strength standard is satisfied. At the same time, in the case of full-strength, the resistance can be made smaller than that in the first embodiment because the resistors are connected in parallel, so a large electric current can be obtained. Accordingly, the two types of output characteristic standards of the semiconductor memory can be simultaneously met, better than in the first embodiment, without adding any new steps, increasing the number of gate masks, or replacing the gate masks.

Also, since the resistors are formed on the output terminal side, the electrostatic withstand voltage of the MIS transistor of the output buffer circuit increases, and this increases the electrostatic withstand voltage as a whole.

Third Embodiment

Figure 5:
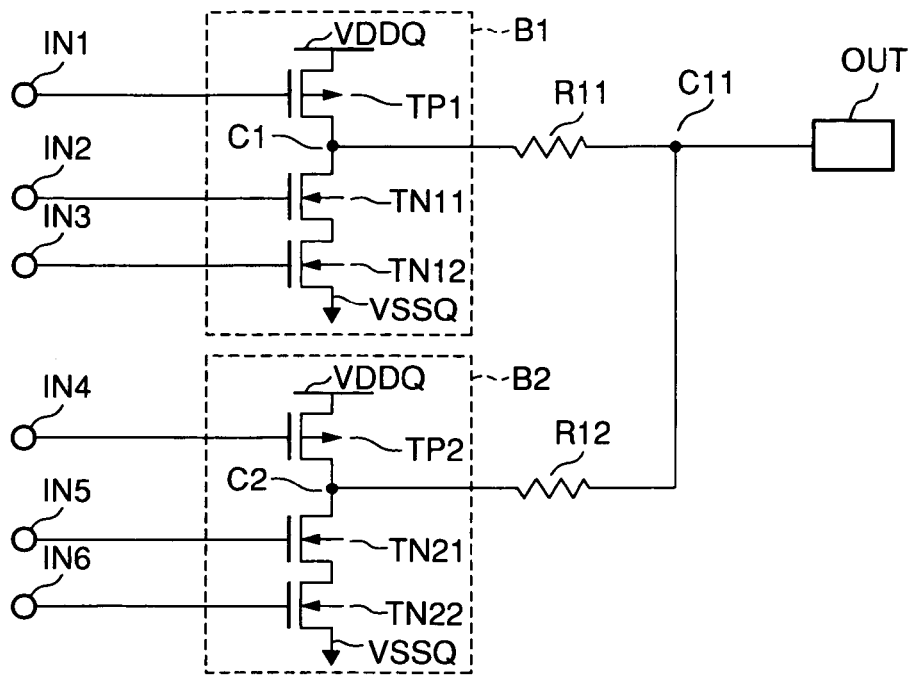
FIG. 5 is a circuit diagram showing an output buffer circuit according to the third embodiment of the present invention.

An output buffer circuit according to the third embodiment of the present invention will be described below with reference to FIG. 5. FIG. 5 is a circuit diagram of this output buffer circuit.

The output buffer circuit of this embodiment is the same as the second embodiment except that two pull-down transistors of a unit circuit are connected in series between a common node and low-potential power supply. So, only this difference will be explained below.

As shown in FIG. 5, the output buffer circuit has first to sixth input terminals IN1, IN2, IN3, IN4, IN5, and IN6 for receiving signals from inside a semiconductor memory, and an output terminal OUT for supplying signals outside the semiconductor memory.

Between a high-potential power supply VDDQ and common node C1, a pull-up transistor TP1 which is, e.g., a P-channel MIS transistor controlled by an input signal from the first input terminal IN1 is connected. Between the common node C1 and a low-potential power supply VSSQ, a first pull-down transistor TN11 which is, e.g., an N-channel MIS transistor controlled by an input signal from the second input terminal IN2 and a second pull-down transistor TN12 which is, e.g., an N-channel MIS transistor controlled by an input signal from the third input terminal IN3 are connected in series. In this manner, a unit circuit B1 is formed.

Similar to the unit circuit B1 described above, a pull-up transistor TP2 which is a P-channel MIS transistor controlled by an input signal from the fourth input terminal IN4 is connected between the high-potential power supply VDDQ and a common node C2, and a first pull-down transistor TN21 which is an N-channel MIS transistor controlled by an input signal from the fifth input terminal IN5 and a second pull-down transistor TN22 which is an N-channel MIS transistor controlled by an input signal from the sixth input terminal IN6 are connected in series between the common node C2 and low-potential power supply VSSQ, thereby forming a unit circuit B2.

First resistors R11 and R12 are connected between the common node C1 of the unit circuit B1 and a common connecting point C11, and between the common node C2 of the unit circuit B2 and the common connecting point C11, respectively. The output terminal OUT is connected to the common connecting point C11. Output currents from the unit circuits B1 and B2 are controlled by input signals applied to the input terminals IN1, IN2, IN3, IN4, IN5, and IN6.

The first resistors R11 and R12 have the same value, and the pull-up transistors TP1 and TP2 and pull-down transistors TN11, TN12, TN21, and TN22 have the same transistor shape (i.e., the same gate length and the same gate width). In addition, the transistors TP1, TP2, TN11, TN12, TN21, and TN22 used in the unit circuits B1 and B2 have a gate length larger than that of transistors used in the semiconductor memory in order to control the process variation.

The operation of the above-mentioned output buffer circuit will be explained below. A full-strength output current on the pull-up side is obtained by turning on both the pull-up transistors TP1 and TP2 by input signals from the input terminals IN1 and IN4, respectively. A half-strength output current on the pull-up side is obtained by turning on one of the pull-up transistors TP1 and TP2 by one of input signals from the input terminals IN1 and IN4, respectively; This half-strength output current is set at about ½ the full-strength output current.

A full-strength output current on the pull-down side is obtained by turning on all the pull-down transistors TN11, TN12, TN21, and TN22 by input signals from the input terminals IN2, IN3, IN5, and IN6, respectively. A half-strength output current on the pull-down side is obtained by turning on the pull-down transistors TN11 and TN12 or TN21 and TN22 by input signals from the input terminals IN2 and IN3 or IN5 and IN6, respectively. This half-strength output current is set at about ½ the full-strength output current.

The high-potential power supply VDDQ is set at a potential, e.g., 3.3 V, higher than the voltage used in the DDR SDRAMs of the first and second embodiments. Between the common node and low-potential power supply, a voltage higher than that in the first and second embodiments is applied.

If the number of pull-down transistors is one as in the first and second embodiments, this pull-down transistor readily deteriorates its characteristics when a high voltage is applied because the gate length of the N-channel MIS transistor used as the pull-down transistor is smaller than that of the P-channel MIS transistor used as the pull-up transistor. This deteriorates the reliability of the output buffer circuit.

Since, however, the two pull-down transistors are connected in series between the common node and low-potential power supply, the voltage applied to one pull-down transistor reduces. This prevents deterioration of the transistor characteristics.

If micropatterning including the gate length (L) of the semiconductor memory advances, the characteristics and reliability margin of the N-channel MIS transistors used as the pull-down transistors and the P-channel MIS transistors used as the pull-up transistors with respect to the power supply voltage deteriorate. This deterioration of the transistor characteristics does not occur when necessary numbers of pull-down and pull-up transistors are respectively connected in series as needed, because the voltage applied to one transistor reduces.

Also, even if the high-potential power supply is required to supply, e.g., 3.3 V or more, necessary numbers of pull-down and pull-up transistors need only be respectively connected in series as needed.

In the output buffer circuit of this embodiment, a metal-film resistor having a resistance variation, voltage change, and temperature change smaller than those of the MIS transistor of the output buffer circuit is formed between the common node of each unit circuit and the common connecting point. This limits the directions in which the half-strength and full-strength output currents in the linear region of the output buffer circuit increase due to variations, thereby reducing variations in both half-strength and full-strength output currents in the linear region of the output buffer circuit.

In the saturation region, the gate length is made larger than that of the transistors in the semiconductor memory. Therefore, the gate length variation reduces, and the output current variation in the saturation region also reduces. Furthermore, since the individual unit circuits have identical resistors, the half-strength standard is satisfied. At the same time, in the case of full-strength, the resistance can be made smaller than that in the first embodiment because the resistors are connected in parallel, so a large electric current can be obtained. Accordingly, the two types of output characteristic standards of the semiconductor memory can be simultaneously met, better than in the first embodiment, without adding any new steps, increasing the number of gate masks, or replacing the gate masks.

Since the two pull-down transistors are connected in series between the common node and low-potential power supply, even if the high-potential power supply voltage is high, the voltage applied to one pull-down transistor reduces, and this prevents deterioration of the pull-down transistor characteristics. Consequently, the reliability improves compared to that in the first and second embodiments.

Also, since the resistors are formed on the output terminal side, the electrostatic withstand voltage of the MIS transistor of the output buffer circuit increases, and this increases the electrostatic withstand voltage as a whole.

Fourth Embodiment

Figure 6:
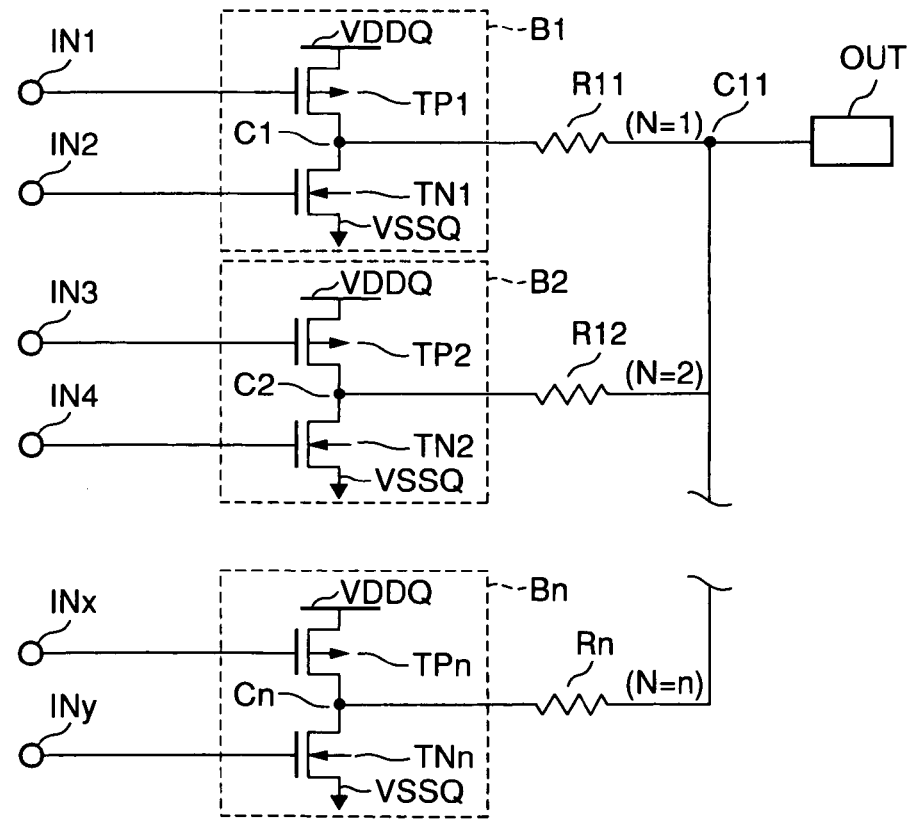
FIG. 6 is a circuit diagram showing an output buffer circuit according to the fourth embodiment of the present invention.

An output buffer circuit according to the fourth embodiment of the present invention will be described below with reference to FIG. 6. FIG. 6 is a circuit diagram of this output buffer circuit.

The output buffer circuit of this embodiment is the same as the second embodiment except that the number of unit circuits increases to n.

As shown in FIG. 6, the output buffer circuit has input terminals IN1, IN2, IN3, IN4, INx, and INy (=2n) for receiving signals from inside a semiconductor memory, and an output terminal OUT for supplying signals outside the semiconductor memory.

Between a high-potential power supply VDDQ and common node C1, a pull-up transistor TP1 which is, e.g., a P-channel MIS transistor controlled by an input signal from the first input terminal IN1 is connected. Between the common node C1 and a low-potential power supply VSSQ, a pull-down transistor TN1 which is, e.g., an N-channel MIS transistor controlled by an input signal from the second input terminal IN2 is connected. In this manner, a unit circuit B1 is formed.

Similar to the unit circuit B1 described above, a pull-up transistor TP2 which is a P-channel MIS transistor controlled by an input signal from the third input terminal IN3 is connected between the high-potential power supply VDDQ and a common node C2, and a pull-down transistor TN2 which is an N-channel MIS transistor controlled by an input signal from the fourth input terminal IN4 is connected between the common node C2 and low-potential power supply VSSQ, thereby forming a unit circuit B2.

Similar to the unit circuits B1 and B2 described above, a pull-up transistor TPn which is a P-channel MIS transistor controlled by an input signal from the Xth input terminal INx is connected between the high-potential power supply VDDQ and a common node Cn, and a pull-down transistor TNn which is an N-channel MIS transistor controlled by an input signal from the Yth input terminal INy is connected between the common node Cn and low-potential power supply VSSQ, thereby forming a unit circuit Bn.

First resistors R11, R12, and Rn are connected between the common node C1 of the unit circuit B1 and a common connecting point C11, between the common node C2 of the unit circuit B2 and the common connecting point C11, and between the common node Cn of the unit circuit Bn and the common connecting point C11, respectively. The output terminal OUT is connected to the common connecting point C11. Output currents from the unit circuits B1, B2, and Bn are controlled by input signals applied to the input terminals IN1, IN2, IN3, IN4, INx, and INy.

The first resistors R11, R12, and Rn have the same value, and the pull-up transistors TP1, TP2, and TPn and pull-down transistors TN1, TN2, and TNn have the same transistor shape (i.e., the same gate length and the same gate width). In addition, the transistors TP1, TP2, TPn, TN1, TN2, and TNn used in the unit circuits B1, B2, and Bn have a gate length larger than that of transistors used in the semiconductor memory in order to control the process variation.

The operation of the above-mentioned output buffer circuit will be explained below. A full-strength output current on the pull-up side is obtained by turning on the pull-up transistors TP1, TP2, and TPn by input signals from the input terminals IN1, IN3, and INx, respectively. A 1/n-strength output current on the pull-up side is obtained by turning on one of the pull-up transistors TP1, TP2, and TPn by one of input signals from the input terminals IN1, IN3, and INn, respectively. This 1/n-strength output current is set at about 1/n the full-strength output current. An intermediate level between the full-strength and 1/n-strength can be obtained by turning on a predetermined number of transistors.

A full-strength output current on the pull-down side is obtained by turning on all the pull-down transistors TN1, TN2, and TNn by input signals from the input terminals IN2, IN4, and Iny, respectively. A 1/n-strength output current on the pull-down side is obtained by turning on one of the pull-down transistors TN1, TN2, and TNn by one of input signals from the input terminals IN2, IN4, and INy, respectively. This 1/n-strength current is set at about 1/n the full-strength output current. An intermediate level between the full-strength and 1/n-strength can be obtained by turning on a predetermined number of transistors.

As in the second embodiment, the variation in output current from the output buffer circuit varies in accordance with the gate length (L) and gate insulating film thickness (TIN) of the MIS transistor used in the output buffer circuit, the variation in high-potential voltage VDDQ, and the operating temperature.

The fabrication variations of the n transistors are added to the full-strength output current, so the variation in output current from the output buffer circuit further increases.

In this output buffer circuit, however, as in the second embodiment, the metal-film resistor is formed between the common node of each unit circuit and the common connecting point in order to reduce the output current variation.

In the output buffer circuit of this embodiment, a metal-film resistor having a resistance variation, voltage change, and temperature change smaller than those of the MIS transistor of the output buffer circuit is formed between the common node of each unit circuit and the common connecting point. This limits the directions in which all the n types of output currents from 1/n to full-strength in the linear region of the output buffer circuit increase due to variations, thereby reducing variations in n types of output currents from 1/n to full-strength of the output buffer circuit in the linear region.

In the saturation region, the gate length is made larger than that of the transistors in the semiconductor memory. Therefore, the gate length variation reduces, and the output current variation in the saturation region also reduces. Furthermore, since the individual unit circuits have identical resistors, the 1/n-strength standard is satisfied. At the same time, in the case of full-strength, the resistance can be made smaller than that in the first embodiment because the resistors are connected in parallel, so a large electric current can be obtained. Accordingly, the n types of output characteristic standards of the semiconductor memory can be simultaneously met without adding any new steps, increasing the number of gate masks, or replacing the gate masks.

Also, since the resistors are formed on the output terminal side, the electrostatic withstand voltage of the MIS transistor of the output buffer circuit increases, and this increases the electrostatic withstand voltage as a whole.

Fifth Embodiment

Figure 7:
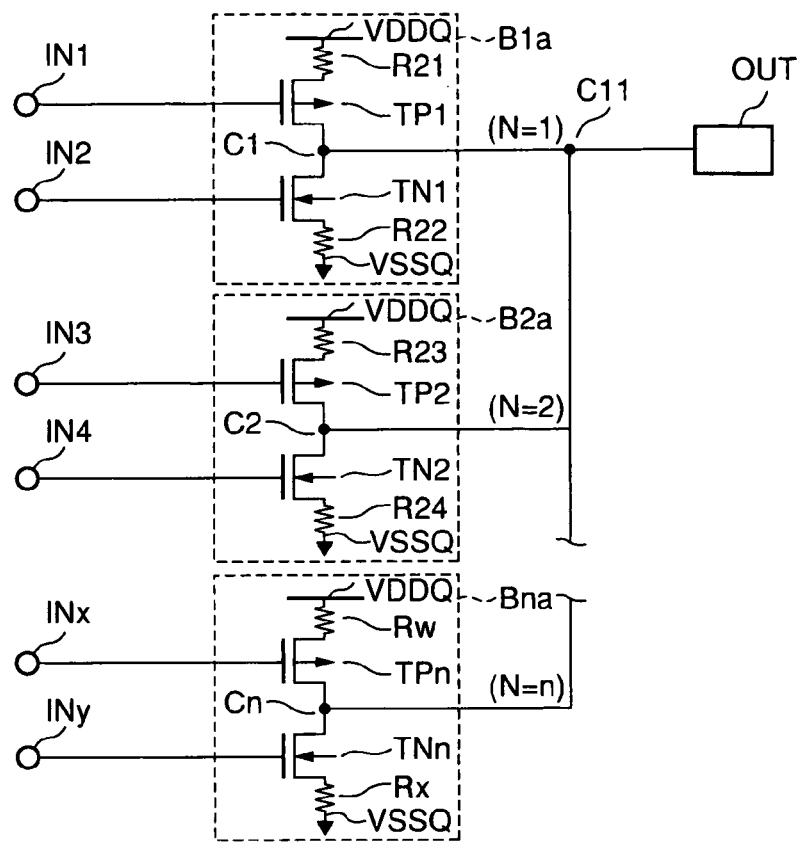
FIG. 7 is a circuit diagram showing an output buffer circuit according to the fifth embodiment of the present invention.

An output buffer circuit according to the fifth embodiment of the present invention will be described below with reference to FIG. 7. FIG. 7 is a circuit diagram of this output buffer circuit.

The output buffer circuit of this embodiment is the same as the fourth embodiment except that the positions and number of resistors are changed.

As shown in FIG. 7, the output buffer circuit has input terminals IN1, IN2, IN3, IN4, INx, and INy (=2n) for receiving signals from inside a semiconductor memory, and an output terminal OUT for supplying signals outside the semiconductor memory.

Between a high-potential power supply VDDQ and common node C1, a pull-up transistor TP1 which is, e.g., a P-channel MIS transistor controlled by an input signal from the first input terminal IN1 is connected. Between the common node C1 and a low-potential power supply VSSQ, a pull-down transistor TN1 which is, e.g., an N-channel MIS transistor controlled by an input signal from the second input terminal IN2 is connected. Second resistors R21 and R22 are connected between the high-potential power supply VDDQ and pull-up transistor TP1 and between the pull-down transistor TN1 and low-potential power supply VSSQ, respectively. In this manner, a unit circuit B1a is formed.

Similar to the unit circuit B1a described above, a pull-up transistor TP2 which is a P-channel MIS transistor controlled by an input signal from the third input terminal IN3 is connected between the high-potential power supply VDDQ and a common node C2, a pull-down transistor TN2 which is an N-channel MIS transistor controlled by an input signal from the fourth input terminal IN4 is connected between the common node C2 and low-potential power supply VSSQ, and second resistors R23 and R24 are connected between the high-potential power supply VDDQ and pull-up transistor TP2 and between the pull-down transistor TN2 and low-potential power supply VSSQ, respectively, thereby forming a unit circuit B2a.

Similar to the unit circuits B1a and B2a described above, a pull-up transistor TPn which is a P-channel MIS transistor controlled by an input signal from the Xth input terminal INx is connected between the high-potential power supply VDDQ and a common node Cn, a pull-down transistor TNn which is an N-channel MIS transistor controlled by an input signal from the Yth input terminal INy is connected between the common node Cn and low-potential power supply VSSQ, and second resistors Rw and Rx are connected between the high-potential power supply VDDQ and pull-up transistor TPn and between the pull-down transistor TNn and low-potential power supply VSSQ, respectively, thereby forming a unit circuit Bna.

The common node C1 of the unit circuit B1a, the common node C2 of the unit circuit B2a, and the common node Cn of the unit circuit Bna are connected together to a common connecting point C11. The output terminal OUT is connected to the common connecting point C11. Output currents from the unit circuits B1a, B2a, and Bn are controlled by input signals applied to the first to Yth input terminals IN1, IN2, IN3, IN4, INx, and INy.

The second resistors R21, R22, R23, R24, Rw, and Rx have the same value which is higher than the wiring resistance.

Also, the pull-up transistors TP1, TP2, and TPn and pull-down transistors TN1, TN2, and TNn have the same transistor shape (i.e., the same gate length and the same gate width). In addition, the transistors TP1, TP2, TPn, TN1, TN2, and TNn forming the unit circuits B1a, B2a, and Bna have a gate length larger than that of transistors used in the semiconductor memory in order to control the process variation.

The operation of the above-mentioned output buffer circuit will be explained below. As in the fourth embodiment, a full-strength output current on the pull-up side is obtained by turning on the pull-up transistors TP1, TP2, and TPn by input signals from the input terminals IN1, IN3, and INx, respectively. A 1/n-strength output current on the pull-up side is obtained by turning on one of the pull-up transistors TP1, TP2, and TPn by one of input signals from the input terminals IN1, IN3, and Inx, respectively. This 1/n-strength output current is set at about 1/n the full-strength output current. An intermediate level between the full-strength and 1/n-strength is obtained by turning on a predetermined number of transistors.

A full-strength output current on the pull-down side is obtained by turning on all the pull-down transistors TN1, TN2, and TNn by input signals from the input terminals IN2, IN4, and Iny, respectively. A 1/n-strength output current on the pull-down side is obtained by turning on one of the pull-down transistors TN1, TN2, and TNn by one of input signals from the input terminals IN2, IN4, and INy, respectively. This 1/n-strength current is set at about 1/n the full-strength output current. An intermediate level between the full-strength and 1/n-strength is obtained by turning on a predetermined number of transistors.

As in the second embodiment, the variation in output current from the output buffer circuit varies in accordance with the gate length (L) and gate insulating film thickness (TIN) of the MIS transistor used in the output buffer circuit, the variation in high-potential voltage VDDQ, and the operating temperature.

The fabrication variations of the n transistors are added to the full-strength output current, so the variation in output current from the output buffer circuit further increases.

In this output buffer circuit, however, the metal-film resistors are formed respectively between the high-potential power supply VDDQ and pull-up transistor and between the pull-down transistor and low-potential power supply VSSQ of each unit circuit in order to reduce the output current variation.

In the output buffer circuit of this embodiment, metal-film resistors having a resistance variation, voltage change, and temperature change smaller than those of the MIS transistor of the output buffer circuit are formed respectively between the high-potential power supply VDDQ and pull-up transistor and between the pull-down transistor and low-potential power supply VSSQ of each unit circuit. This limits the directions in which all the n types of output currents from 1/n to full-strength in the linear region of the output buffer circuit increase due to variations, thereby reducing variations in n types of output currents from 1/n to full-strength of the output buffer circuit in the linear region.

In the saturation region, the gate length is made larger than that of the transistors in the semiconductor memory. Therefore, the gate length variation reduces, and the output current variation in the saturation region also reduces. Furthermore, since the individual unit circuits have identical resistors, the 1/n-strength standard is satisfied. At the same time, in the case of full-strength, the resistance can be made smaller than that in the first embodiment because the resistors are connected in parallel, so a large electric current can be obtained. Accordingly, the n types of output characteristic standards of the semiconductor memory can be simultaneously met without adding any new steps, increasing the number of gate masks, or replacing the gate masks.

Sixth Embodiment

Figure 8:
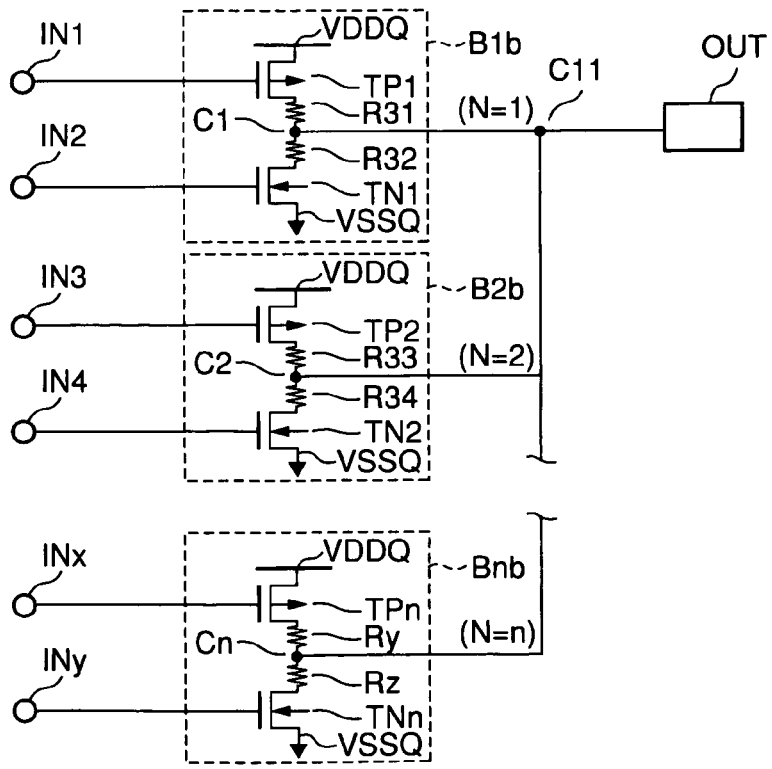
FIG. 8 is a circuit diagram showing an output buffer circuit according to the sixth embodiment of the present invention.

An output buffer circuit according to the sixth embodiment of the present invention will be described below with reference to FIG. 8. FIG. 8 is a circuit diagram of this output buffer circuit.

The output buffer circuit of this embodiment is the same as the fourth embodiment except that the positions and number of resistors are changed.

As shown in FIG. 8, the output buffer circuit has input terminals IN1, IN2, IN3, IN4, INx, and INy (=2n) for receiving signals from inside a semiconductor memory, and an output terminal OUT for supplying signals outside the semiconductor memory.

Between a high-potential power supply VDDQ and common node C1, a pull-up transistor TP1 which is, e.g., a P-channel MIS transistor controlled by an input signal from the first input terminal IN1 is connected. Between the common node C1 and a low-potential power supply VSSQ, a pull-down transistor TN1 which is, e.g., an N-channel MIS transistor controlled by an input signal from the second input terminal IN2 is connected. Third resistors R31 and R32 are connected between the pull-up transistor TP1 and common node C1 and between the common node C1 and pull-down transistor TN1, respectively. In this manner, a unit circuit B1b is formed.

Similar to the unit circuit B1b described above, a pull-up transistor TP2 which is a P-channel MIS transistor controlled by an input signal from the third input terminal IN3 is connected between the high-potential power supply VDDQ and a common node C2, a pull-down transistor TN2 which is an N-channel MIS transistor controlled by an input signal from the fourth input terminal IN4 is connected between the common node C2 and low-potential power supply VSSQ, and third resistors R33 and R34 are connected between the pull-up transistor TP2 and common node C2 and between the common node C2 and pull-down transistor TN2, respectively, thereby forming a unit circuit B2b.

Similar to the unit circuits B1b and B2b described above, a pull-up transistor TPn which is a P-channel MIS transistor controlled by an input signal from the Xth input terminal INx is connected between the high-potential power supply VDDQ and a common node Cn, a pull-down transistor TNn which is an N-channel MIS transistor controlled by an input signal from the Yth input terminal INy is connected between the common node Cn and low-potential power supply VSSQ, and third resistors Ry and Rz are connected between the pull-up transistor TPn and common node Cn and between the common node Cn and pull-down transistor TNn, respectively, thereby forming a unit circuit Bnb.

The common node C1 of the unit circuit B1b, the common node C2 of the unit circuit B2b, and the common node Cn of the unit circuit Bnb are connected together to a common connecting point C11. The output terminal OUT is connected to the common connecting point C11. Output currents from the unit circuits B1b, B2b, and Bnb are controlled by input signals applied to the first to Yth input terminals IN1, IN2, IN3, IN4, INx, and INy.

The third resistors R31, R32, R33, R34, Ry, and Rz have the same value which is higher than the wiring resistance. Also, the pull-up transistors TP1, TP2, and TPn and pull-down transistors TN1, TN2, and TNn have the same transistor shape (i.e., the same gate length and the same gate width). In addition, the transistors TP1, TP2, TPn, TN1, TN2, and TNn forming the unit circuits B1b, B2b, and Bnb have a gate length larger than that of transistors used in the semiconductor memory in order to control the process variation.

The operation of the above-mentioned output buffer circuit will be explained below. As in the fourth embodiment, a full-strength output current on the pull-up side is obtained by turning on the pull-up transistors TP1, TP2, and TPn by input signals from the input terminals IN1, IN3, and INx, respectively. A 1/n-strength output current on the pull-up side is obtained by turning on one of the pull-up transistors TP1, TP2, and TPn by one of input signals from the input terminals IN1, IN3, and Inx, respectively. This 1/n-strength output current is set at about 1/n the full-strength output current. An intermediate level between the full-strength and 1/n-strength is obtained by turning on a predetermined number of transistors.

A full-strength output current on the pull-down side is obtained by turning on all the pull-down transistors TN1, TN2, and TNn by input signals from the input terminals IN2, IN4, and Iny, respectively. A 1/n-strength output current on the pull-down side is obtained by turning on one of the pull-down transistors TN1, TN2, and TNn by one of input signals from the input terminals IN2, IN4, and INy, respectively. This 1/n-strength current is set at about 1/n the full-strength output current. An intermediate level between the full-strength and 1/n-strength is obtained by turning on a predetermined number of transistors.

As in the second embodiment, the variation in output current from the output buffer circuit varies in accordance with the gate length (L) and gate insulating film thickness (TIN) of the MIS transistor used in the output buffer circuit, the variation in high-potential voltage VDDQ, and the operating temperature.

The fabrication variations of the n transistors are added to the full-strength output current, so the variation in output current from the output buffer circuit further increases.

In this output buffer circuit, however, the metal-film resistors are formed respectively between the high-potential power supply VDDQ and pull-up transistor and between the pull-down transistor and low-potential power supply of each unit circuit in order to reduce the output current variation.

In the output buffer circuit of this embodiment, metal-film resistors having a resistance variation, voltage change, and temperature change smaller than those of the MIS transistor of the output buffer circuit are formed respectively between the pull-up transistor and common node and between the common node and pull-down transistor of each unit circuit. This limits the directions in which all the n types of output currents from 1/n to full-strength in the linear region of the output buffer circuit increase due to variations, thereby reducing variations in n types of output currents from 1/n to full-strength of the output buffer circuit in the linear region.

In the saturation region, the gate length is made larger than that of the transistors in the semiconductor memory. Therefore, the gate length variation reduces, and the output current variation in the saturation region also reduces. Furthermore, since the individual unit circuits have identical resistors, the 1/n-strength standard is satisfied. At the same time, in the case of full-strength, the resistance can be made smaller than that in the first embodiment because the resistors are connected in parallel, so a large electric current can be obtained. Accordingly, the n types of output characteristic standards of the semiconductor memory can be simultaneously met without adding any new steps, increasing the number of gate masks, or replacing the gate masks.

Seventh Embodiment

Figure 9:
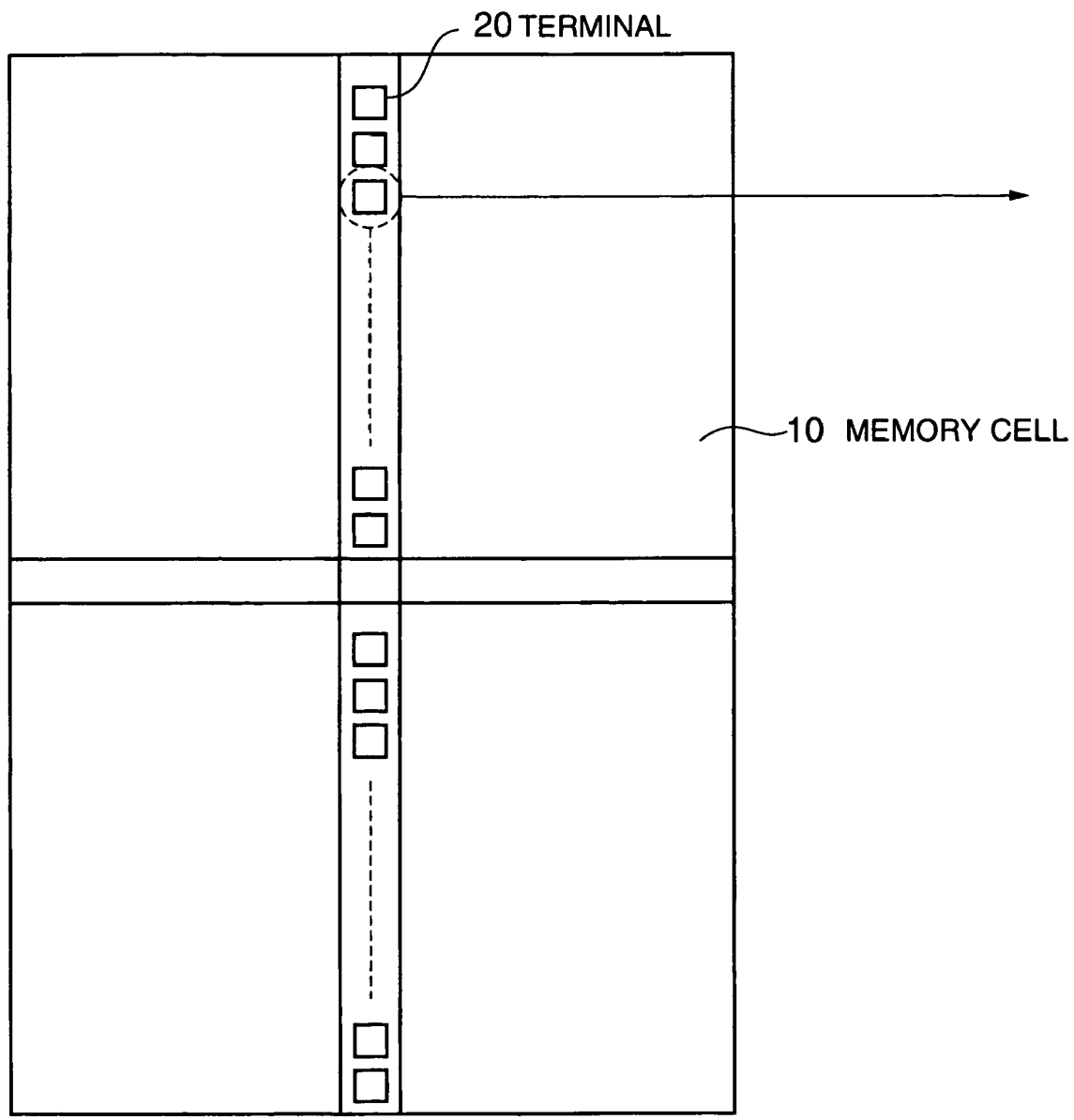
FIG. 9 is a top view showing a semiconductor memory according to the seventh embodiment of the present invention.
Figure 10:
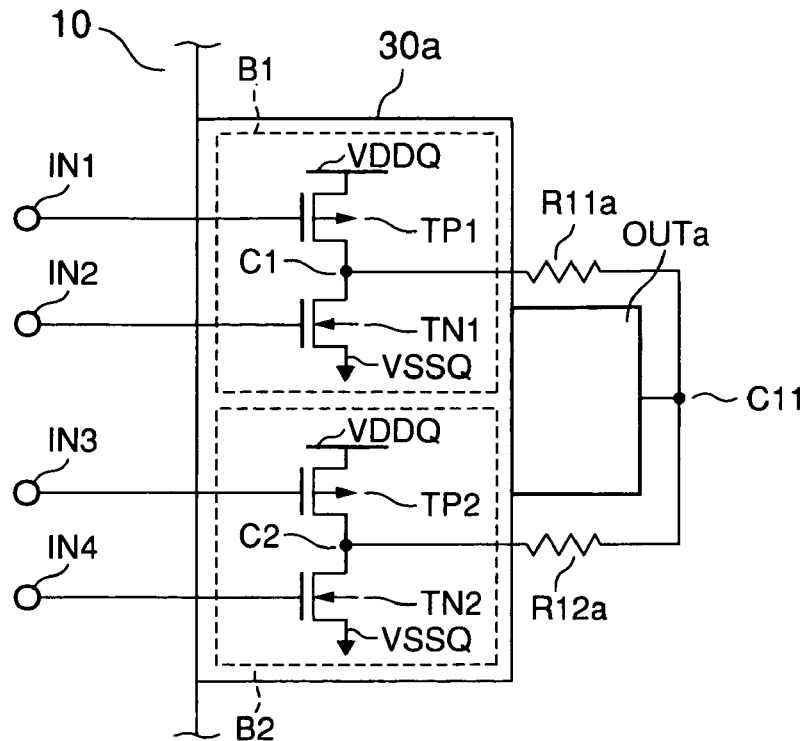
FIG. 10 is an enlarged top view showing an output buffer circuit and output terminal portion according to the seventh embodiment of the present invention.

A semiconductor memory according to the seventh embodiment of the present invention will be described below with reference to FIGS. 9 and 10. FIG. 9 is a top view of the semiconductor memory. FIG. 10 is an enlarged top view of an output buffer circuit and output terminal portion.

The seventh embodiment is a 256-Mb DDR SDRAM including the output buffer circuit of the second embodiment.

In this semiconductor memory as shown in FIG. 9, sixteen 16-Mb memory cells 10, sixteen output buffer circuits 30a, and a plurality of rectangular terminals 20 including an output terminal OUTa of each output buffer circuit 30a are formed on a chip. The output buffer circuits 30a and terminals 20 are formed between the symmetrically arranged memory cells 10.

As shown in FIG. 10, each output buffer circuit 30a is formed between the memory cell 10 and output terminal OUTa.

First resistors R11a and R12a made of a metal film are formed on two opposing sides, e.g., upper and lower sides in the longitudinal direction of the paper, of the output terminal OUTa. The first transistors R11a and R12a are symmetrically arranged in the upper and lower portions of the output terminal OUTa, and have the same value, the same size, and the same shape.

End portions on one side of the first resistors R11a and R12a are connected to common nodes C1 and C2, respectively, of the output buffer circuit 30a. The other ends of the first resistors R11a and R12a are connected together to a common connecting point C11 which is connected to the output terminal OUTa.

This arrangement reduces variations in resistance of the first resistors R11a and R12a, and also improves the paring properties of these resistors. In this embodiment, the first resistors R11a and R12a have the same size and the same shape. However, two resistors having only the same value can also be symmetrically arranged in the upper and lower portions.

In the semiconductor memory of this embodiment, metal-film resistors symmetrically arranged with respect to the output terminal, having the same value, the same size, and the same shape, and also having a small resistance variation, small voltage change, and small temperature change are formed respectively between the common nodes of the unit circuits and the common connecting point, thereby limiting the directions in which half-strength and full-strength output currents in the linear region of the output buffer circuit of the semiconductor memory increase due to variations. This reduces both the half-strength and full-strength output current variations of the output buffer circuit in the linear region.

In the saturation region of the output buffer circuit of the semiconductor memory, the gate length is made larger than that of transistors in the semiconductor memory. Therefore, the gate length variation reduces, and the output current variation in the saturation region also reduces. Furthermore, since the individual unit circuits have identical resistors, the half-strength standard is satisfied. At the same time, in the case of full-strength, the resistance can be made smaller than that in the first embodiment because the resistors are connected in parallel, so a large electric current can be obtained. Accordingly, the output buffer circuit which satisfies the two types of output characteristic standards at the same time can be incorporated into the semiconductor memory without adding any new steps, increasing the number of gate masks, or replacing the gate masks.

Also, since the resistors are formed on the output terminal side, the electrostatic withstand voltage of the MIS transistors of the output buffer circuit increases. This increases the electrostatic withstand voltage of the output buffer circuit, and hence increases the electrostatic withstand voltage as a whole.

In the above seventh embodiment, the output buffer circuit of the second embodiment is used in a semiconductor memory. However, the output buffer circuit of any of the first, third, and fourth embodiments may also be used.

Eighth Embodiment

Figure 11:
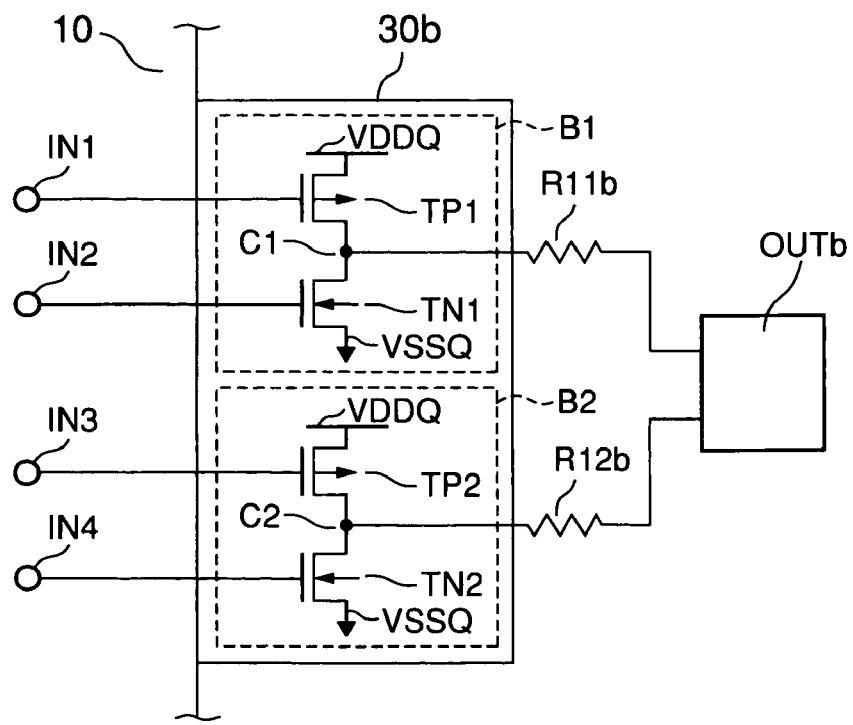
FIG. 11 is an enlarged top view showing an output buffer circuit and output terminal portion according to the eighth embodiment of the present invention.
Figure 12:
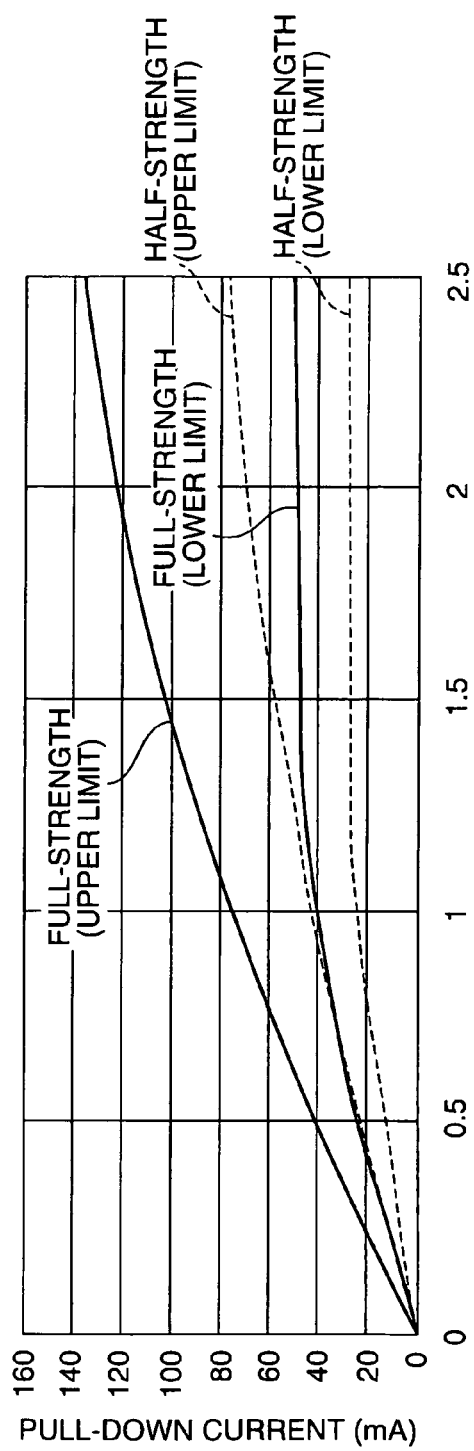
FIG. 12 is a graph showing driver characteristic specifications required of an output buffer circuit.
Figure 13:
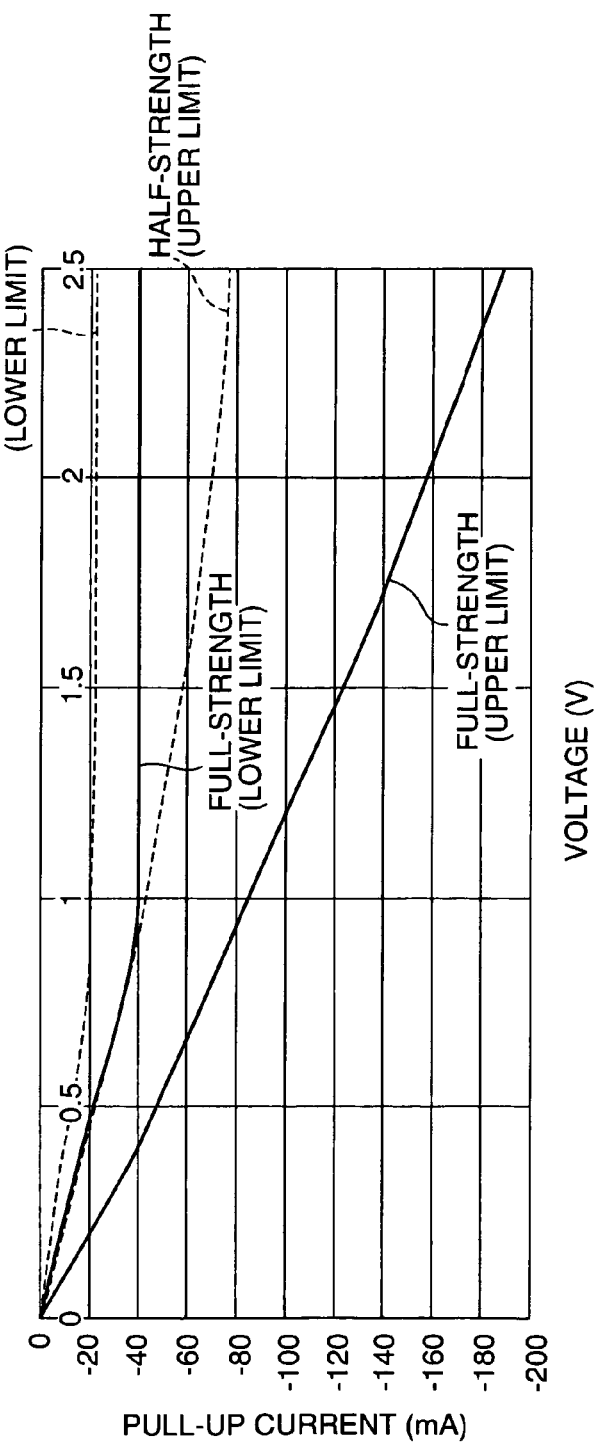
FIG. 13 is a graph showing driver characteristic specifications required of an output buffer circuit.

A semiconductor memory according to the eighth embodiment of the present invention will be described below with reference to FIG. 11. FIG. 11 is an enlarged top view of an output buffer circuit and output terminal portion.

The semiconductor memory of this embodiment is the same as the seventh embodiment except that the positions of resistors are changed. Therefore, only the difference will be explained below.

As shown in FIG. 11, first resistors R11b and R12b made of a metal film are formed between an output buffer circuit 30b and output terminal OUTb. End portions on one side of the first resistors R11b and R12b are connected to common nodes C1 and C2, respectively, of the output buffer circuit 30b. The other ends of the first resistors R11b and R12b are connected together to the output terminal OUTb.

The first resistors R11b and R12b are symmetrically arranged in the upper and lower positions with respect to the central line of the output terminal OUTb and output buffer circuit 30b, and have the same value, the same size, and the same shape. This arrangement reduces variations in resistance of the first resistors R11b and R12b, and also improves the paring properties of these resistors. In this embodiment, the first resistors R11b and R12b have the same size and the same shape. However, two resistors having only the same value can also be symmetrically arranged in the upper and lower positions.

In the semiconductor memory of this embodiment, metal-film resistors symmetrically arranged with respect to the central line of the output terminal and output buffer circuit, having the same value, the same size, and the same shape, and also having a small resistance variation, small voltage change, and small temperature change are formed respectively between the common nodes of the unit circuits and the output terminal, thereby limiting the directions in which half-strength and full-strength output currents in the linear region of the output buffer circuit of the semiconductor memory increase due to variations. This reduces both the half-strength and full-strength output current variations of the output buffer circuit in the linear region.

In the saturation region of the output buffer circuit of the semiconductor memory, the gate length is made larger than that of transistors in the semiconductor memory. Therefore, the gate length variation reduces, and the output current variation in the saturation region also reduces. Furthermore, since the individual unit circuits have identical resistors, the half-strength standard is satisfied. At the same time, in the case of full-strength, the resistance can be made smaller than that in the first embodiment because the resistors are connected in parallel, so a large electric current can be obtained. Accordingly, the output buffer circuit which satisfies the two types of output characteristic standards at the same time can be incorporated into the semiconductor memory without adding any new steps, increasing the number of gate masks, or replacing the gate masks.

Also, since the resistors are formed on the output terminal side, the electrostatic withstand voltage of the MIS transistors of the output buffer circuit increases. This increases the electrostatic withstand voltage of the output buffer circuit, and hence increases the electrostatic withstand voltage as a whole.

In the above eighth embodiment, the output buffer circuit of the second embodiment is used in a semiconductor memory. However, the output buffer circuit of any of the first, third, and fourth embodiments may also be used. Also, in each of the seventh and eighth embodiments described above, the terminals 20 including the output terminals are formed between the symmetrically arranged memory cells 10. However, the terminals 20 may also be arranged along the perimeter of the chip of the semiconductor memory.

In the first to eighth embodiments described above, a plurality of types of standards concerning the output characteristics of a semiconductor integrated circuit such as a semiconductor memory can be simultaneously satisfied without adding any new steps, increasing the number of gate masks, or replacing the gate masks.

The present invention is not limited to the above embodiments, and can be variously modified without departing from the spirit and scope of the invention.

For example, in the above embodiments, P- and N-channel MIS transistors are used in the output buffer circuit. However, the present invention is applicable to an output buffer circuit including BiNMOS, BiPMOS, BiCMOS, and bipolar transistors, and the application of this output buffer circuit is not limited a semiconductor memory.

Figure 14:
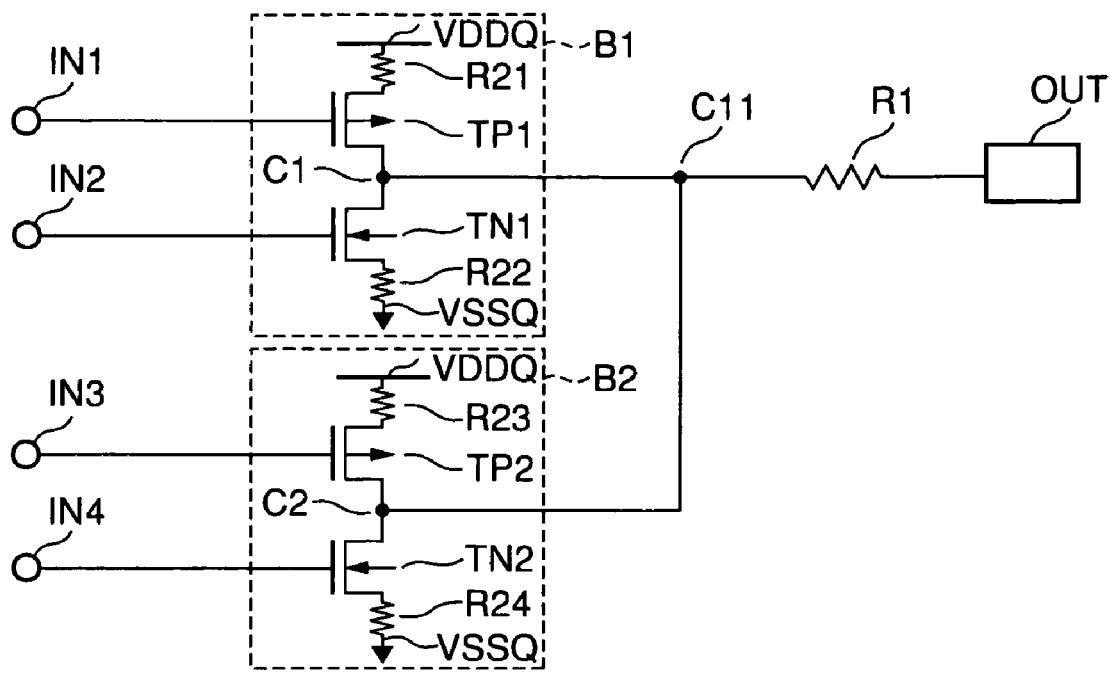
FIGS. 14 and 15 are circuit diagrams showing modifications of the first embodiment.

In the first embodiment, as shown in FIG. 14, it is also possible to add second resistors R21 and R23 between the high-potential power supply and pull-up transistors, and second resistors R22 and R24 between the pull-down transistors and low-potential power supply.

Figure 15:
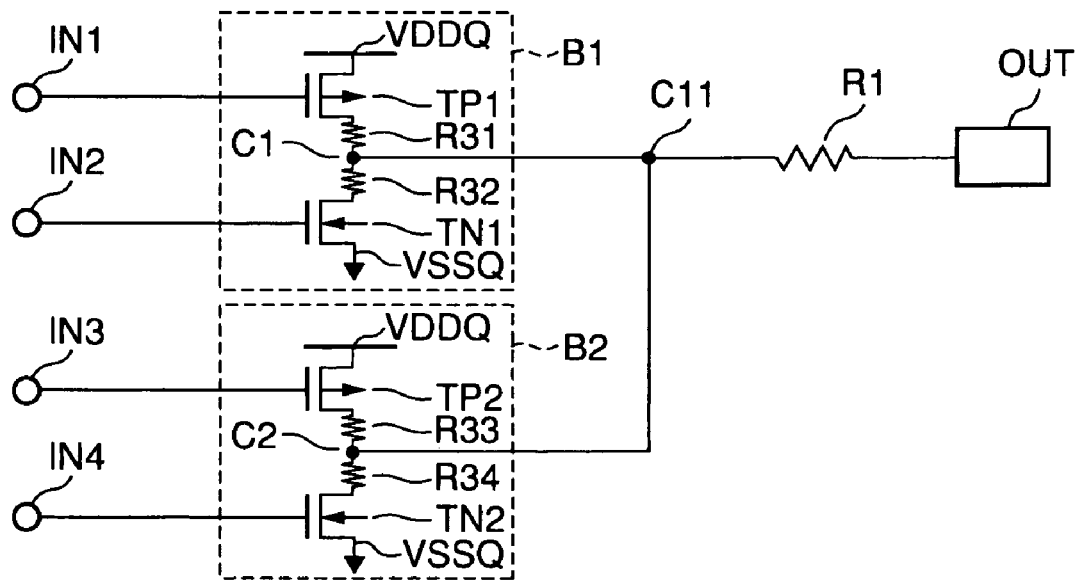

Alternatively, as shown in FIG. 15, it is possible to add third resistors R31 and R33 between the pull-up transistors and common nodes, and third resistors R32 and R34 between the common nodes and pull-down transistors.

Figure 16:
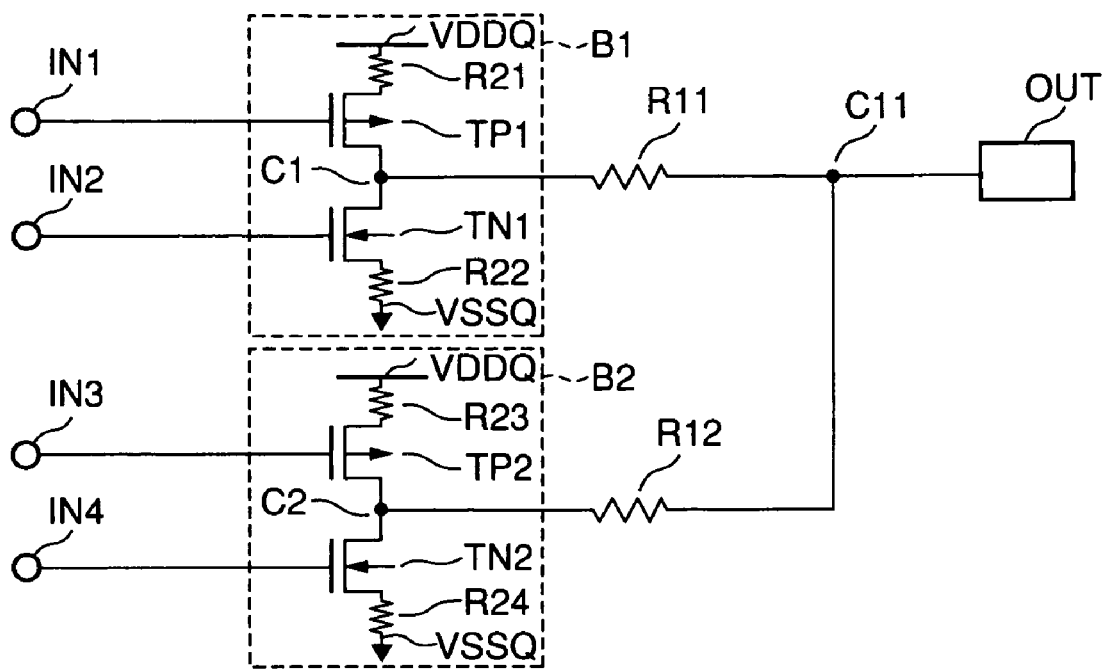
FIGS. 16 and 17 are circuit diagrams showing modifications of the second embodiment.

Likewise, in the second embodiment, as shown in FIG. 16, it is also possible to add second resistors R21 and R23 between the high-potential power supply and pull-up transistors, and second resistors R22 and R24 between the pull-down transistors and low-potential power supply.

Figure 17:
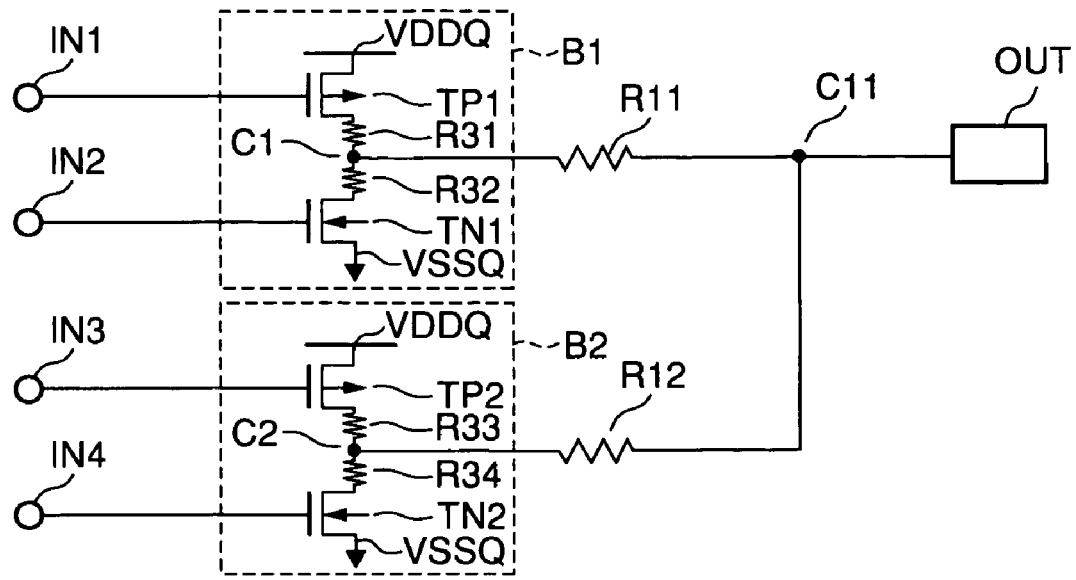

Alternatively, as shown in FIG. 17, it is possible to add third resistors R31 and R33 between the pull-up transistors and common nodes, and third resistors R32 and R34 between the common nodes and pull-down transistors.

Figure 18:
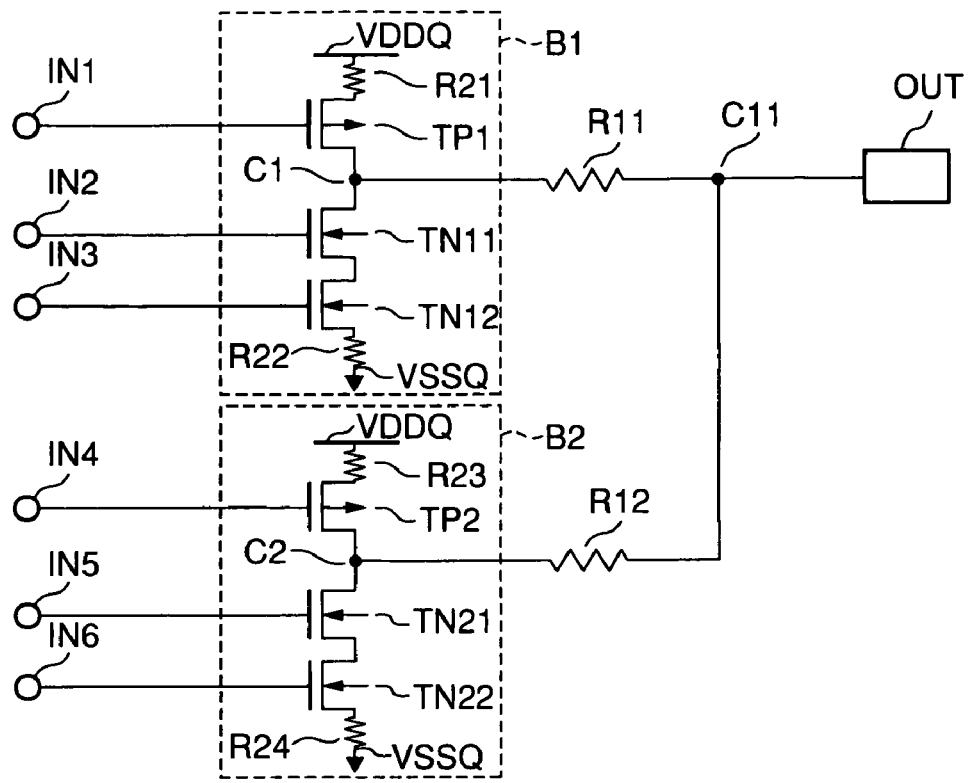
FIGS. 18 and 19 are circuit diagrams showing modifications of the third embodiment.

Similarly, in the third embodiment, as shown in FIG. 18, it is also possible to add second resistors R21 and R23 between the high-potential power supply and pull-up transistors, and second resistors R22 and R24 between the pull-down transistors and low-potential power supply.

Figure 19:
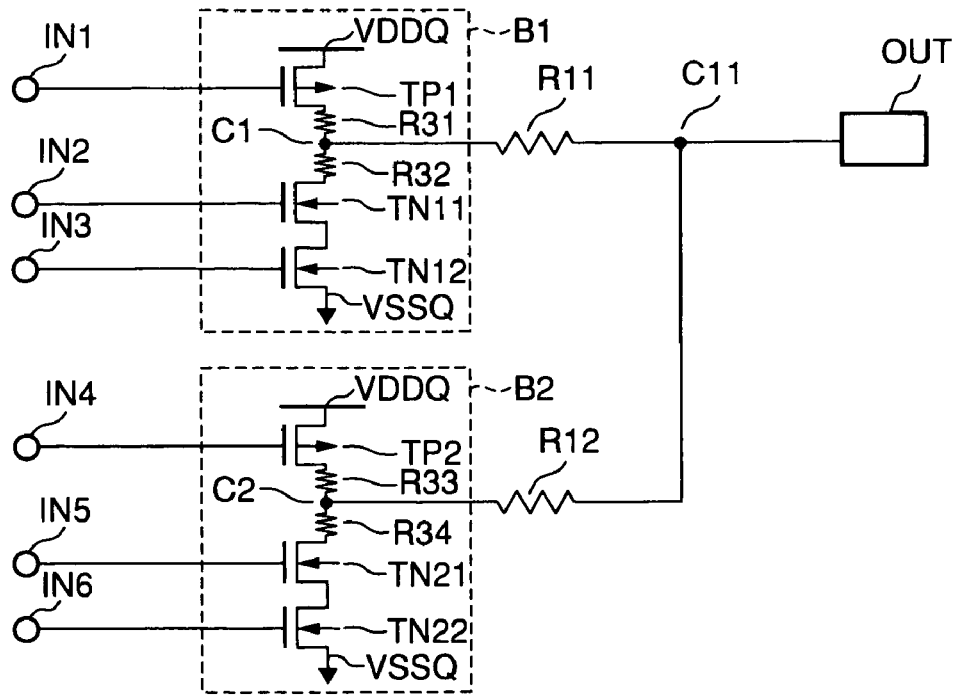

Alternatively, as shown in FIG. 19, it is possible to add third resistors R31 and R33 between the pull-up transistors and common nodes, and third resistors R32 and R34 between the common nodes and pull-down transistors.

Figure 20:
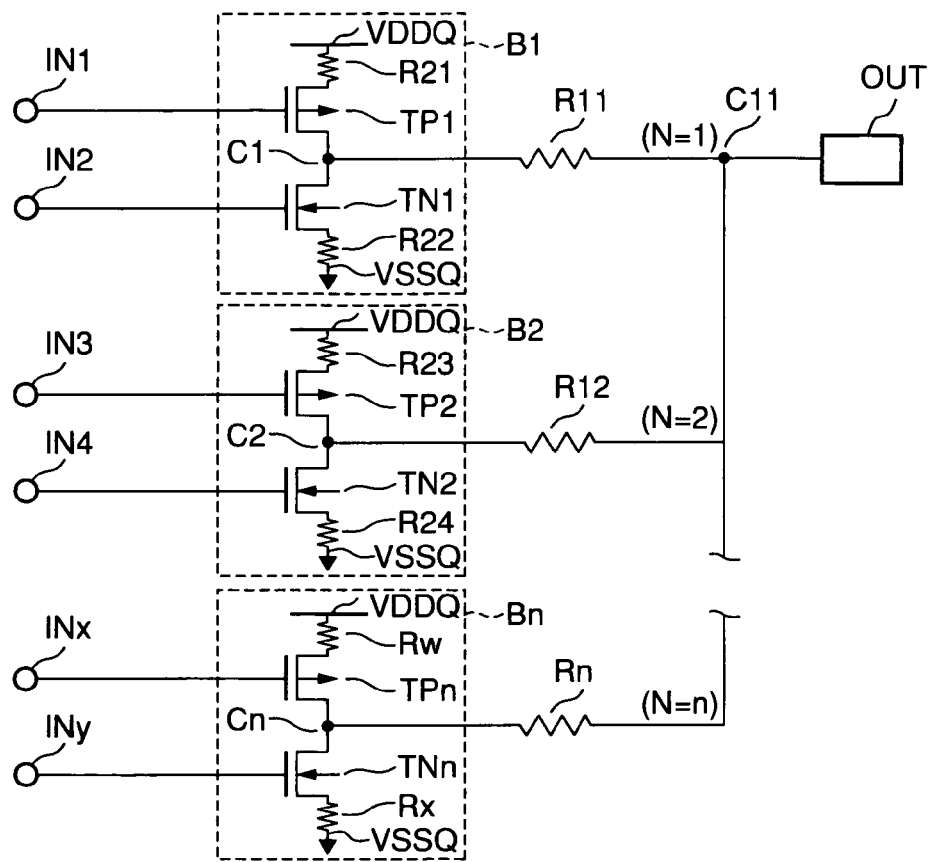
FIGS. 20 and 21 are circuit diagrams showing modifications of the fourth embodiment.

Analogously, in the fourth embodiment, as shown in FIG. 20, it is also possible to add second resistors R21, R23, . . . , Rw between the high-potential power supply and pull-up transistors, and second resistors R22, R24, . . . , Rx between the pull-down transistors and low-potential power supply.

Figure 21:
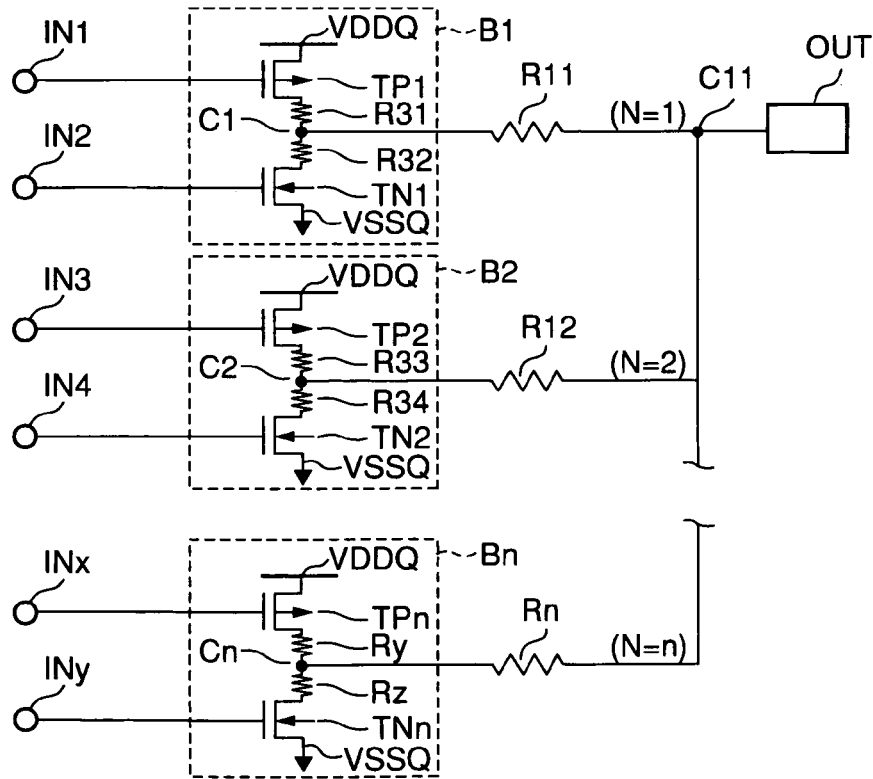

Alternatively, as shown in FIG. 21, it is possible to add third resistors R31, R33, . . . , Ry between the pull-up transistors and common nodes, and third resistors R32, R34, . . . , Rz between the common nodes and pull-down transistors.

Furthermore, in each of the third and fourth embodiments, two pull-up transistors may also be connected in series between the high-potential power supply and common node. Alternatively, it is possible to connect a plurality of pull-up transistors in series between the high-potential power supply and common node, and a plurality of pull-down transistors in series between the common node and low-potential power supply.

What is claimed is:

1. An output buffer circuit comprising:
a plurality of unit circuits in each of which a pull-up transistor controlled by a first input signal is connected between a high-potential power supply and common node, and a first pull-down transistor controlled by a second input signal and a second pull-down transistor controlled by a third input signal are connected in series between said common node and a low-potential power supply;
an output terminal connected to a common connecting point of said common nodes of said plurality of unit circuits;
first resistors formed respectively between said common nodes of said plurality of unit circuits and said common connecting; and
second resistors formed respectively between said high-potential power supply and pull-up transistor and between said pull-down transistor and low-potential power supply in each of said plurality of unit circuits.

2. An output buffer circuit comprising:
a plurality of unit circuits in each of which a plurality of pull-up transistors controlled by an input signal are connected in series between a high-potential power supply and common nodes, and a plurality of pull-down transistors controlled by an input signal are connected in series between said common nodes and a low-potential power supply;
an output terminal connected to a common connecting point of said common nodes of said plurality of unit circuits; and
first resistors formed respectively between said common nodes of said plurality of unit circuits and said common connecting; and third resistors formed respectively between said pull-up transistors and common nodes and between said common nodes and pull-down transistors in each of said plurality of unit circuits.

3. The output buffer circuit according to claim 1, wherein said plurality of second resistors formed respectively between said high-potential power supply and pull-up transistor and between said pull-down transistor and low-potential power supply have the same resistance.

4. The output buffer circuit according to claim 2, wherein said plurality of third resistors formed respectively between said pull-up transistors and common nodes and between said common nodes and pull-down transistors have the same resistance.

5. The output buffer circuit according to claim 2, wherein said plurality of first resistors formed between said common nodes and output terminal have the same resistance.

6. The output buffer circuit according to claim 2, wherein each of said pull-up and pull-down transistors is a MIS transistor.

7. The output buffer circuit according to claim 2, wherein said plurality of pull-up transistors have the same gate length and the same gate width, and said plurality of pull-down transistors have the same gate length and the same gate width.

8. The output buffer circuit according to claim 2, wherein said resistor is selected from the group consisting of a metal film, composite metal film, metal cermet film, polysilicon film, diffusion layer, and transistor.

9. A semiconductor memory comprising:
a plurality of memory cells;
a plurality of terminals including an output terminal; and
an output buffer circuit positioned adjacent to said memory cell, said output buffer circuit comprising a plurality of unit circuits in each of which a pull-up transistor controlled by a first input signal is connected between a high-potential power supply and common node and a pull-down transistor controlled by a second input signal is connected between said common node and a low-potential power supply, and comprising first resistors connected respectively between said common nodes of said plurality of unit circuits and a common connecting point of said common nodes,
wherein said first resistors are formed between said output buffer circuit and output terminal, and
wherein, if the number of said first resistors is an even number, said first resistors are symmetrically arranged with respect to a central line of said output buffer circuit and output terminal, and have the same value, the same size, and the same shape.

10. A semiconductor memory comprising:
a plurality of memory cells;
a plurality of terminals including an output terminal; and
an output buffer circuit positioned adjacent to said memory cell, said output buffer circuit comprising a plurality of unit circuits in each of which a pull-up transistor controlled by a first input signal is connected between a high-potential power supply and common node and a pull-down transistor controlled by a second input signal is connected between said common node and a low-potential power supply, and comprising first resistors connected respectively between said common nodes of said plurality of unit circuits and a common connecting point of said common nodes,
wherein said first resistors are formed between said output buffer circuit and output terminal and said first resistors are formed on at least not less than one of three sides of said output terminal, which do not oppose said output buffer circuit.

11. The semiconductor memory according to claim 10, wherein if the number of first resistors is two, said first resistors are symmetrically arranged in portions of said output terminal, which do not oppose said output buffer circuit, and have the same value, the same size, and the same shape.

* * * * *